United States Patent
Lim et al.

(10) Patent No.: US 11,538,810 B2
(45) Date of Patent: Dec. 27, 2022

(54) WIRING STRUCTURES, METHODS OF FORMING THE SAME, AND SEMICONDUCTOR DEVICES INCLUDING THE SAME

(71) Applicant: SAMSUNG ELECTRONICS CO., LTD., Suwon-si (KR)

(72) Inventors: Hyunseok Lim, Suwon-si (KR); Minhyuk Cho, Suwon-si (KR); Kyung-Eun Byun, Suwon-si (KR); Hyeonjin Shin, Suwon-si (KR); Kaoru Yamamoto, Suwon-si (KR); Jungsoo Yoon, Suwon-si (KR); Soyoung Lee, Suwon-si (KR); Geuno Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 84 days.

(21) Appl. No.: 17/225,601

(22) Filed: Apr. 8, 2021

(65) Prior Publication Data

US 2022/0085025 A1    Mar. 17, 2022

(30) Foreign Application Priority Data

Sep. 14, 2020   (KR) .................. 10-2020-0117704

(51) Int. Cl.
   *H01L 27/108*      (2006.01)
(52) U.S. Cl.
   CPC .. *H01L 27/10814* (2013.01); *H01L 27/10823* (2013.01); *H01L 27/10855* (2013.01); *H01L 27/10876* (2013.01); *H01L 27/10885* (2013.01); *H01L 27/10888* (2013.01)

(58) Field of Classification Search
   None
   See application file for complete search history.

(56) References Cited

U.S. PATENT DOCUMENTS

| | | | |
|---|---|---|---|
| 7,045,839 B2* | 5/2006 | Song | H01L 27/11502 257/295 |
| 7,052,951 B2* | 5/2006 | Joo | H01L 27/11502 257/E21.664 |
| 8,482,126 B2* | 7/2013 | Wada | H01L 23/5226 257/222 |
| 8,715,610 B2 | 5/2014 | Wallace et al. | |
| 8,724,369 B2 | 5/2014 | Zhang et al. | |
| 9,337,149 B2 | 5/2016 | Im et al. | |
| 9,362,422 B2* | 6/2016 | Lim | H01L 27/10823 |
| 9,722,068 B2 | 8/2017 | Wenxu et al. | |
| 9,837,423 B2* | 12/2017 | Oh | H01L 27/10876 |
| 10,211,086 B2 | 2/2019 | Nagai | |
| 10,529,720 B2* | 1/2020 | Sills | H01L 29/66666 |
| 2017/0092592 A1* | 3/2017 | Shin | H01L 23/5283 |
| 2019/0081067 A1* | 3/2019 | Eom | H01L 27/11543 |
| 2022/0052055 A1* | 2/2022 | Chun | H01L 27/10885 |
| 2022/0085025 A1* | 3/2022 | Lim | H01L 27/10814 |

* cited by examiner

*Primary Examiner* — Steven M Christopher
(74) *Attorney, Agent, or Firm* — Lee IP Law, P.C.

(57) ABSTRACT

A wiring structure includes a first conductive pattern including doped polysilicon on a substrate, an ohmic contact pattern including a metal silicide on the first conductive pattern, an oxidation prevention pattern including a metal silicon nitride on the ohmic contact pattern, a diffusion barrier including graphene on the oxidation prevention pattern, and a second conductive pattern including a metal on the diffusion barrier.

20 Claims, 25 Drawing Sheets

WIRING STRUCTURES, METHODS OF FORMING THE SAME, AND SEMICONDUCTOR DEVICES INCLUDING THE SAME

CROSS-REFERENCE TO RELATED APPLICATION

Korean Patent Application No. 10-2020-0117704, filed on Sep. 14, 2020, in the Korean Intellectual Property Office, and entitled: "Wiring Structures, Methods of Forming the Same, and Semiconductor Devices Including the Same," is incorporated by reference herein in its entirety.

BACKGROUND

1. Field

Embodiments relate to a wiring structure, a method of forming the same, and a semiconductor device including the same.

2. Description of the Related Art

If a wiring structure includes a polysilicon layer doped with impurities and a metal layer, it is needed to reduce a contact resistance between the polysilicon layer and the metal layer and prevent elements of the polysilicon layer and the metal layer from diffusing. Thus, an ohmic contact layer or a diffusion barrier may be formed between the polysilicon layer and the metal layer. However, if the ohmic contact layer or the diffusion barrier has a thick thickness, a thickness of the wiring structure may increase.

SUMMARY

Embodiments are directed to a wiring structure, including a first conductive pattern including doped polysilicon on a substrate, an ohmic contact pattern including a metal silicide on the first conductive pattern, an oxidation prevention pattern including a metal silicon nitride on the ohmic contact pattern, a diffusion barrier including graphene on the oxidation prevention pattern, and a second conductive pattern including a metal on the diffusion barrier. The first conductive pattern, the ohmic contact pattern, the oxidation prevention pattern, the diffusion barrier, and the second conductive pattern may be sequentially stacked in the stated order on the substrate.

Embodiments are also directed to a wiring structure, including a first conductive pattern including doped polysilicon on a substrate, an ohmic contact pattern including a metal silicide on the first conductive pattern, a diffusion barrier including graphene on the ohmic contact pattern, an oxidation prevention pattern including a metal nitride on the diffusion barrier, and a second conductive pattern including a metal on the oxidation prevention pattern. The first conductive pattern, the ohmic contact pattern, the diffusion barrier, the oxidation prevention pattern, and the second conductive pattern may be sequentially stacked in the stated order on the substrate.

Embodiments are also directed to a method of forming a wiring structure. In the method, a first conductive layer including doped polysilicon may be formed on a substrate. An ohmic contact layer including a metal silicide may be formed on the first conductive layer. An oxidation prevention layer including a metal silicon nitride may be formed on the ohmic contact layer by a nitridation treatment process. A diffusion barrier layer including graphene may be formed on the oxidation prevention layer. A second conductive layer including a metal may be formed on the diffusion barrier layer. The second conductive layer, the diffusion barrier layer, the oxidation prevention layer, the ohmic contact layer and the first conductive layer may be patterned by an etching process using a mask to form a first conductive pattern, an ohmic contact pattern, an oxidation prevention pattern, a diffusion barrier and a second conductive pattern sequentially stacked on the substrate.

Embodiments are also directed to a method of forming a wiring structure. In the method, a first conductive layer including doped polysilicon may be formed on a substrate. A diffusion barrier layer including graphene may be formed on the first conductive layer. A metal layer may be formed on the diffusion barrier layer so that an ohmic contact layer including a metal silicide may be formed between the first conductive layer and the diffusion barrier layer. A nitridation treatment process may be performed on the metal layer to form an oxidation prevention layer on the diffusion barrier layer. A second conductive layer including a metal may be formed on the diffusion barrier layer. The second conductive layer, the oxidation prevention layer, the diffusion barrier layer, the ohmic contact layer and the first conductive layer may be patterned by an etching process using a mask to form a first conductive pattern, an ohmic contact pattern, a diffusion barrier, an oxidation prevention pattern, and a second conductive pattern sequentially stacked on the substrate.

Embodiments are also directed to a semiconductor device, including an active pattern on a substrate, a gate structure buried at an upper portion of the active pattern, a bit line structure on the active pattern, a contact plug structure on a portion of the active pattern adjacent to the bit line structure, and a capacitor on the contact plug structure. The bit line structure may include a first conductive pattern including doped polysilicon, a first ohmic contact pattern including a metal silicide on the first conductive pattern, a first oxidation prevention pattern including a metal silicon nitride on the first ohmic contact pattern, a first diffusion barrier including graphene on the first oxidation prevention pattern, and a second conductive pattern including a metal on the first diffusion barrier. The first conductive pattern, the first ohmic contact pattern, the first oxidation prevention pattern, the first diffusion barrier, and the second conductive pattern may be sequentially stacked in the stated order.

Embodiments are also directed to a semiconductor device, including an active pattern on a substrate, a gate structure buried at an upper portion of the active pattern, a bit line structure on the active pattern, a contact plug structure on a portion of the active pattern adjacent to the bit line structure, and a capacitor on the contact plug structure. The bit line structure may include a first conductive pattern including doped polysilicon, a first ohmic contact pattern including a metal silicide on the first conductive pattern, a first diffusion barrier including graphene on the first ohmic contact pattern, an oxidation prevention pattern including a metal nitride on the first diffusion barrier, and a second conductive pattern including a metal on the oxidation prevention pattern. The first conductive pattern, the first ohmic contact pattern, the first diffusion barrier, the oxidation prevention pattern, and the second conductive pattern may be sequentially stacked in the stated order.

BRIEF DESCRIPTION OF THE DRAWINGS

Features will become apparent to those of skill in the art by describing in detail example embodiments with reference to the attached drawings in which.

DETAILED DESCRIPTION

Figure 1:
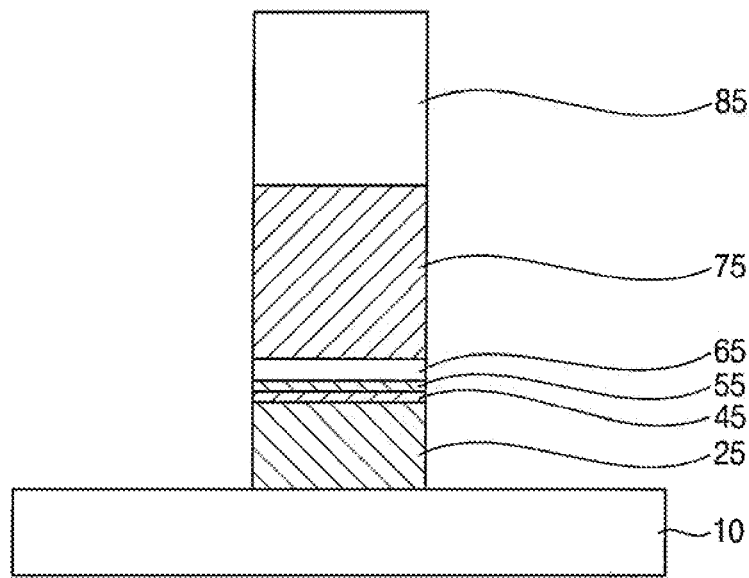
FIG. 1 is a cross-sectional view illustrating a wiring structure in accordance with example embodiments.

FIG. 1 is a cross-sectional view illustrating a wiring structure in accordance with example embodiments.

Referring to FIG. 1, the wiring structure may include a first conductive pattern 25, an ohmic contact pattern 45, an oxidation prevention pattern 55, a diffusion barrier 65, and a second conductive pattern 75, which may be sequentially stacked on a substrate 10. A mask 85 may be on the wiring structure, e.g., on the second conductive pattern 75.

The substrate 10 may include silicon, germanium, silicon-germanium, or a III-V group compound semiconductor, such as GaP, GaAs, or GaSb. In example embodiments, the substrate 10 may be a silicon-on-insulator (SOI) substrate or a germanium-on-insulator (GOI) substrate.

In example embodiments, the first conductive pattern 25 may include polysilicon doped with impurities.

In example embodiments, the ohmic contact pattern 45 may include a metal silicide. In an example embodiment, the ohmic contact pattern 45 may include titanium silicide (TiSi$_2$). In another implementation, the ohmic contact pattern 45 may include tantalum silicide or tungsten silicide.

The ohmic contact pattern 45 may have a thickness of about 0.1 nm to about 1 nm. In an example embodiment, the ohmic contact pattern 45 may have a thickness of about 0.5 nm.

In example embodiments, the oxidation prevention pattern 55 may include a metal silicon nitride. In an example embodiment, the oxidation prevention pattern 55 may include titanium silicon nitride (TiSiN). In another implementation, the oxidation prevention pattern 55 may include tantalum silicon nitride or tungsten silicon nitride.

The oxidation prevention pattern 55 may have a thickness of about 0.1 nm to about 1 nm. In an example embodiment, the oxidation prevention pattern 55 may have a thickness of about 0.5 nm.

In example embodiments, the diffusion barrier 65 may include graphene. The diffusion barrier 65 may have a thickness of about 0.5 nm to about 2 nm. In an example embodiment, the diffusion barrier 65 may have a thickness of about 1 nm.

The second conductive pattern 75 may include a material having a resistance less than that of the first conductive pattern 25, for example, a low resistance metal such as tungsten, aluminum, copper, ruthenium, molybdenum, rhodium, iridium, etc.

The mask 85 may include a nitride, e.g., silicon nitride.

The wiring structure may include the ohmic contact pattern 45, the oxidation prevention pattern 55 and the diffusion barrier 65 sequentially stacked between the first and second conductive patterns 25 and 75.

The diffusion barrier 65 may reduce or prevent silicon in the first conductive pattern 25 and the metal in the second conductive pattern 75 from diffusing. The diffusion barrier 65 may have a relatively reduced thickness when compared to the general diffusion barrier, and thus the wiring structure including the diffusion barrier 65 may have a reduced thickness.

The ohmic contact pattern 45 may enhance ohmic characteristics between the first and second conductive patterns 25 and 75. As the ohmic contact pattern 45 is formed between the first and second conductive patterns 25 and 75, a contact resistance between the first and second conductive patterns 25 and 75 may be reduced, and a total resistance of the wiring structure except for the mask 85 may be reduced. As illustrated below with reference to FIGS. 2 to 5, the ohmic contact pattern 45 may be formed on the first conductive pattern 25, and thus a resistance increase due to a natural oxide layer may be prevented.

A metal oxide layer, e.g., titanium oxide layer, tantalum oxide layer, tungsten oxide layer, etc., may be further formed between the first conductive pattern 25 and the oxidation prevention pattern 55, however, the metal oxide layer may not be formed on an entire upper surface of the first conductive pattern 25 but formed on a portion of the upper surface of the first conductive pattern 25. Accordingly, the resistance increase due to the metal oxide layer may be very slight.

The oxidation prevention pattern 55 may block oxygen from being provided onto the ohmic contact pattern 45, so that a natural oxide layer may not be formed.

The ohmic contact pattern 45 and the oxidation prevention pattern 55 may have a lesser thickness than the diffusion barrier 65, and thus, even though the ohmic contact pattern 45 and the oxidation prevention pattern 55 are formed between the first and second conductive patterns 25 and 75, the wiring structure may have a reduced thickness. In an example embodiment, a combined thickness of the ohmic contact pattern 45 and the oxidation prevention pattern 55 may be less than or equal to the thickness of the diffusion barrier 65.

The wiring structure may provide a reduced resistance even with a reduced thickness.

FIGS. 2 to 5 are cross-sectional views illustrating a method of forming a wiring structure in accordance with example embodiments.

Figure 2:
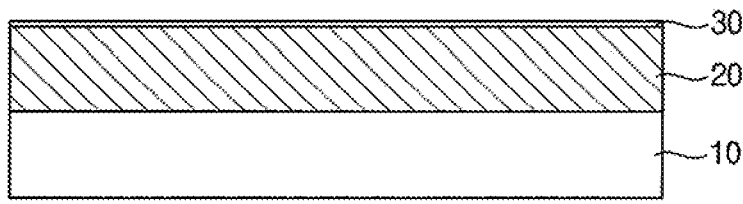
FIGS. 2 to 5 are cross-sectional views illustrating a method of forming a wiring structure in accordance with example embodiments.

Referring to FIG. 2, a first conductive layer 20 may be formed on a substrate 10.

In example embodiments, the first conductive layer 20 may include polysilicon doped with impurities.

A natural oxide layer 30 may be formed on the first conductive layer 20 by oxygen included in the air.

Figure 3:
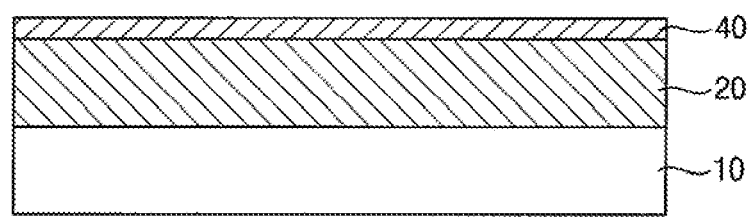

Referring to FIG. 3, the natural oxide layer 30 on the first conductive layer 20 may be removed.

In example embodiments, the natural oxide layer 30 may be removed by a plasma treatment process. The plasma treatment process may be performed using, e.g., hydrogen plasma, argon plasma, etc.

Even though the plasma treatment process is performed, the natural oxide layer 30 on the first conductive layer 20 may not be entirely removed but some portions thereof may remain. In another implementation, the plasma treatment process may not be performed, and in this case, the natural oxide layer 30 may remain on the first conductive layer 20.

Referring to FIG. 3, an ohmic contact layer 40 may be formed on the first conductive layer 20. The ohmic contact layer 40 may be performed by, e.g., a chemical vapor deposition (CVD) process, a plasma enhanced chemical vapor deposition (PE-CVD) process, an atomic layer deposition (ALD) process, etc.

In an example embodiment, a PE-CVD process may be performed using titanium tetrachloride ($TiCl_4$) as a precursor at a temperature of equal to or less than about 700° C. to form a titanium layer on the first conductive layer 20, and silicon included in the first conductive layer 20 may be combined with the titanium layer to form the ohmic contact layer 40 including titanium silicide.

If the natural oxide layer 30 remains entirely or partially on the upper surface of the first conductive layer 20, the natural oxide layer 30 may be combined with titanium to form a titanium oxide ($TiO_2$) layer, however, the titanium oxide layer may not be entirely formed on the upper surface of the first conductive layer 20 but only partially formed thereon. As the ohmic contact layer 40 is formed, the entire portion or most portion of the upper surface of the first conductive layer 20 may be covered by the ohmic contact layer 40.

In another implementation, a deposition process may be performed using tantalum or tungsten as a precursor, so that the ohmic contact layer 40 may be formed to include tantalum silicide or tungsten silicide.

The ohmic contact layer 40 may include a thickness of about 0.2 nm to about 2 nm.

Figure 4:
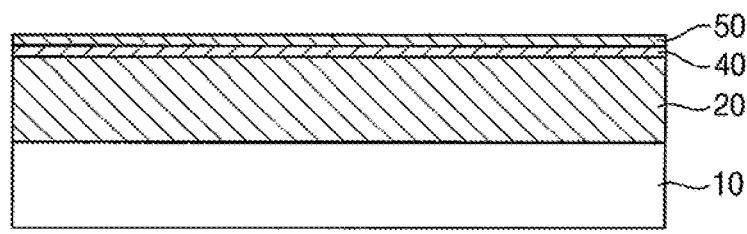

Referring to FIG. 4, a nitridation treatment process may be performed on the ohmic contact layer 40 to form an oxidation prevention layer 50 including a metal silicon nitride.

In example embodiments, the nitridation treatment process may be performed by a plasma treatment process or a thermal treatment process under an atmosphere of ammonia ($NH_3$) gas or nitrogen ($N_2$) gas.

In example embodiments, an upper portion of the ohmic contact layer 40 may be nitridated to form the oxidation prevention layer 50. Each of the ohmic contact layer 40 and the oxidation prevention layer 50 may have a thickness of about 0.1 nm to about 1 nm. For example, approximately one-half of the thickness of the ohmic contact layer 40 may be converted to the corresponding nitride.

As described above, if the ohmic contact layer 40 includes titanium silicide, the oxidation prevention layer 50 may include titanium silicon nitride. In another implementation, if the ohmic contact layer 40 includes tantalum silicide or tungsten silicide, the oxidation prevention layer 50 may include tantalum silicon nitride or tungsten silicon nitride, respectively.

As the oxidation prevention layer 50 is formed on the upper surface of the ohmic contact layer 40, a natural oxide layer may not be formed on the upper surface of the ohmic contact layer 40 by oxygen included in the air.

Figure 5:
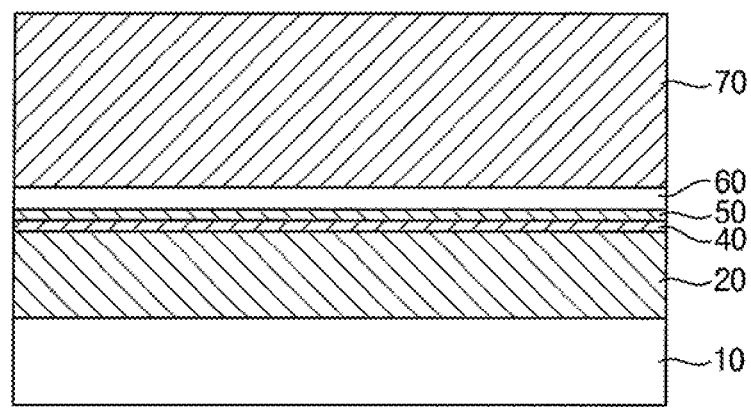

Referring to FIG. 5, a diffusion barrier layer 60 may be formed on the oxidation prevention layer 50, and a second conductive layer 70 may be formed on the diffusion barrier layer 60.

In example embodiments, the diffusion barrier layer 60 may be formed by a CVD process using, e.g., a hydrocarbon as a precursor, e.g., hydrogen or argon as a carrier gas, and, e.g., heat or plasma as energy source for decomposing the precursor. The diffusion barrier layer 60 may have a thickness of about 0.5 nm to about 2 nm. The diffusion barrier layer 60 may be, e.g., a graphene layer formed by, e.g., reduction and/or decomposition of the hydrocarbon precursor.

In example embodiments, the process for forming the oxidation prevention layer 50 and the process for forming the diffusion barrier layer 60 may be performed in-situ, and thus the formation of the natural oxide layer may be prevented.

Referring to FIG. 1 again, a mask 85 may be formed on the second conductive layer 70, and the second conductive layer 70, the diffusion barrier layer 60, the oxidation prevention layer 50, the ohmic contact layer 40, and the first conductive layer 20 may be sequentially etched and patterned using the mask 85 as an etching mask to form the wiring structure on the substrate 10.

As described above, before forming the diffusion barrier layer 60 on the first conductive layer 20, the ohmic contact layer 40 may be formed on the first conductive layer 20, and thus the natural oxide layer 30 remaining on the first conductive layer 20 may be removed. Even though the ohmic contact layer 40 is formed, the metal oxide layer may remain on the first conductive layer 20, however, the metal oxide layer may not be formed on the entire upper surface of the first conductive layer 20 but only a very small portion of the upper surface of the first conductive layer 20, which may cause only a very slight increase of resistance. Additionally, an additional plasma treatment process may be performed on the natural oxide layer 30, and thus the formation of the metal oxide layer may be prevented.

The ohmic contact layer 40 may enhance ohmic contact characteristics between the first and second conductive layers 20 and 70, and thus the contact resistance therebetween may be reduced.

Additionally, the oxidation prevention layer 50 may be formed on the ohmic contact layer 40 by the nitridation treatment process on the upper surface of the ohmic contact layer 40, and thus the formation of the natural oxide layer by oxygen included in the air may be prevented.

The diffusion barrier layer 60 between the first and second conductive layers 20 and 70 may serve as a barrier for preventing or reducing the diffusion of elements included in the first and second conductive layers 20 and 70.

The diffusion barrier layer 60 may have a thickness of about 1 nm, and each of the ohmic contact layer 40 and the oxidation prevention layer 50 sequentially stacked on the diffusion barrier layer 60 may also have a thickness of about 0.5 nm. Thus, the wiring structure including the ohmic contact layer 40, the oxidation prevention layer 50, and the diffusion barrier layer 60 may have a reduced total thickness, and may provide a reduced resistance and enhanced diffusion barrier characteristics between the first and second conductive patterns 25 and 75.

Figure 6:
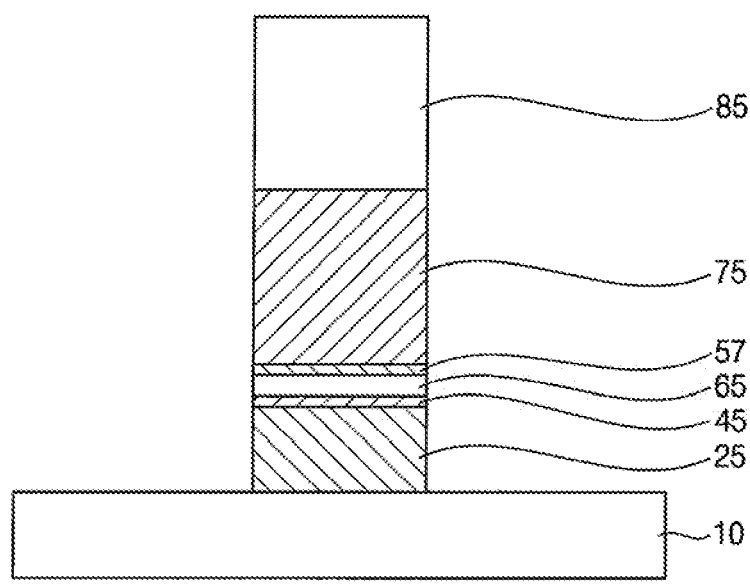
FIG. 6 is a cross-sectional view illustrating a wiring structure in accordance with example embodiments.

FIG. 6 is a cross-sectional view illustrating a wiring structure in accordance with example embodiments. The wiring structure may be substantially the same as or similar to that of FIG. 1, except for the oxidation prevention pattern. Thus, like reference numerals refer to like elements, and detailed descriptions thereon are omitted herein.

Referring to FIG. 6, the wiring structure may include the first conductive pattern 25, the ohmic contact pattern 45, the diffusion barrier 65, an oxidation prevention pattern 57, and the second conductive pattern 75 sequentially stacked on the substrate 10. The mask 85 may be on the second conductive pattern 75.

Thus, the wiring structure may not include the oxidation prevention pattern 55 between the ohmic contact pattern 45 and the diffusion barrier 65, but may include the oxidation prevention pattern 57 between the diffusion barrier 65 and the second conductive pattern 75.

In example embodiments, the oxidation prevention pattern 57 may include a metal nitride. In an example embodiment, the oxidation prevention pattern 57 may include titanium nitride. In another implementation, the oxidation prevention pattern 57 may include tantalum nitride or tungsten nitride.

The oxidation prevention pattern 57 may block oxygen from being provided onto the diffusion barrier 65 so as to prevent the formation of a natural oxide layer. The oxidation prevention pattern 57 may have a thickness of about 0.1 nm to about 1 nm. In an example embodiment, the oxidation prevention pattern 57 may have a thickness of about 0.5 nm.

Figure 7:
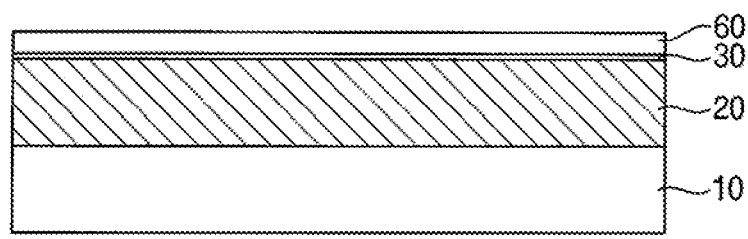
FIGS. 7 and 8 are cross-sectional views illustrating a method of forming a wiring structure in accordance with example embodiments.
Figure 8:
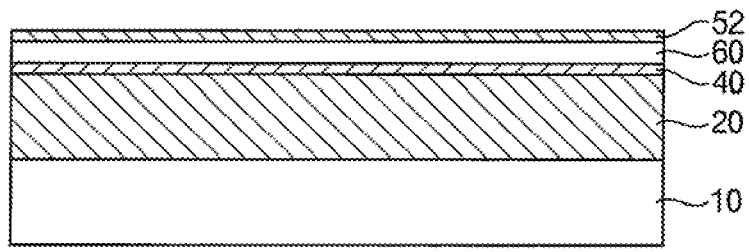

FIGS. 7 and 8 are cross-sectional views illustrating a method of forming a wiring structure in accordance with example embodiments. This method may include processes substantially the same as or similar to those illustrated with reference to FIGS. 2 to 5 and FIG. 1, and thus repeated explanations thereon are omitted herein.

Referring to FIG. 7, processes substantially the same as or similar to those illustrated with reference to FIG. 2 may be performed to form the first conductive layer 20 on the substrate 10, and the natural oxide layer 30 may be formed on the first conductive layer 20. The natural oxide layer 30 may be entirely or partially removed by a plasma treatment process, or entirely remain on the first conductive layer 20 with no plasma treatment process.

Processes substantially the same as or similar to those illustrated with reference to FIG. 5 may be performed to form the diffusion barrier layer 60 on the first conductive layer 20.

Referring to FIG. 8, processes substantially the same as or similar to those illustrated with reference to FIGS. 3 and 4 may be performed to form the ohmic contact layer 40 between the first conductive layer 20 and the diffusion barrier layer 60 and to form an oxidation prevention layer 52 on the ohmic contact layer 40.

In an example embodiment, a PE-CVD process may be performed using, e.g., titanium tetrachloride (TiCl$_4$) as a precursor at a temperature of equal to or less than about 700° C. to form a titanium layer on the diffusion barrier layer 60. A portion of the titanium layer may move through the diffusion barrier layer 60 to an upper surface of the first conductive layer 20, and may be combined with silicon included in the first conductive layer 20. Thus, the ohmic contact layer 40 may be formed on the first conductive layer 20 to include titanium silicide (TiSi$_2$). If, e.g., a tantalum layer or a tungsten layer is formed on the diffusion barrier layer 60 instead of the titanium layer, the ohmic contact layer 40 may be formed to include tantalum silicide or tungsten silicide, respectively.

Unlike the structure illustrated in FIG. 3, the ohmic contact layer 40 may not be directly formed on the upper surface of the first conductive layer 20, and titanium may move through the diffusion barrier layer 60 to the upper surface of the first conductive layer 20 to form the ohmic contact layer 40, so that the ohmic contact layer 40 may not be excessively formed. Thus, the diffusion barrier layer 60 may serve as a filter for filtering titanium, and thus the ohmic contact layer 40 may have a thickness of about 0.5 nm, which may be a minimum thickness for ohmic contact characteristics.

As the ohmic contact layer 40 is formed on the first conductive layer 20, the natural oxide layer 30 on the first conductive layer 20 may be mostly removed, and some portions of the natural oxide layer 30 may remain, but may not entirely cover the upper surface of the first conductive layer 20.

After the ohmic contact layer 40 is formed on the first conductive layer 20, a nitridation treatment process may be performed on the titanium layer on the diffusion barrier layer 60 to form an oxidation prevention layer 52 including titanium nitride. As the oxidation prevention layer 52 is formed, oxygen may not be provided onto the diffusion barrier layer 60, so as to prevent the formation of the natural oxide layer.

The oxidation prevention layer 52 may have a thickness of about 0.5 nm. The oxidation prevention layer 52 may include, e.g., tantalum nitride, tungsten nitride, etc., instead of the titanium nitride.

Referring to FIG. 6 again, the second conductive layer 70 may be formed on the oxidation prevention layer 52, and processes substantially the same as or similar to those illustrated with reference to FIG. 1 may be performed to form the second conductive pattern 75 and underlying patterns, and complete the formation of the wiring structure.

Figure 9:
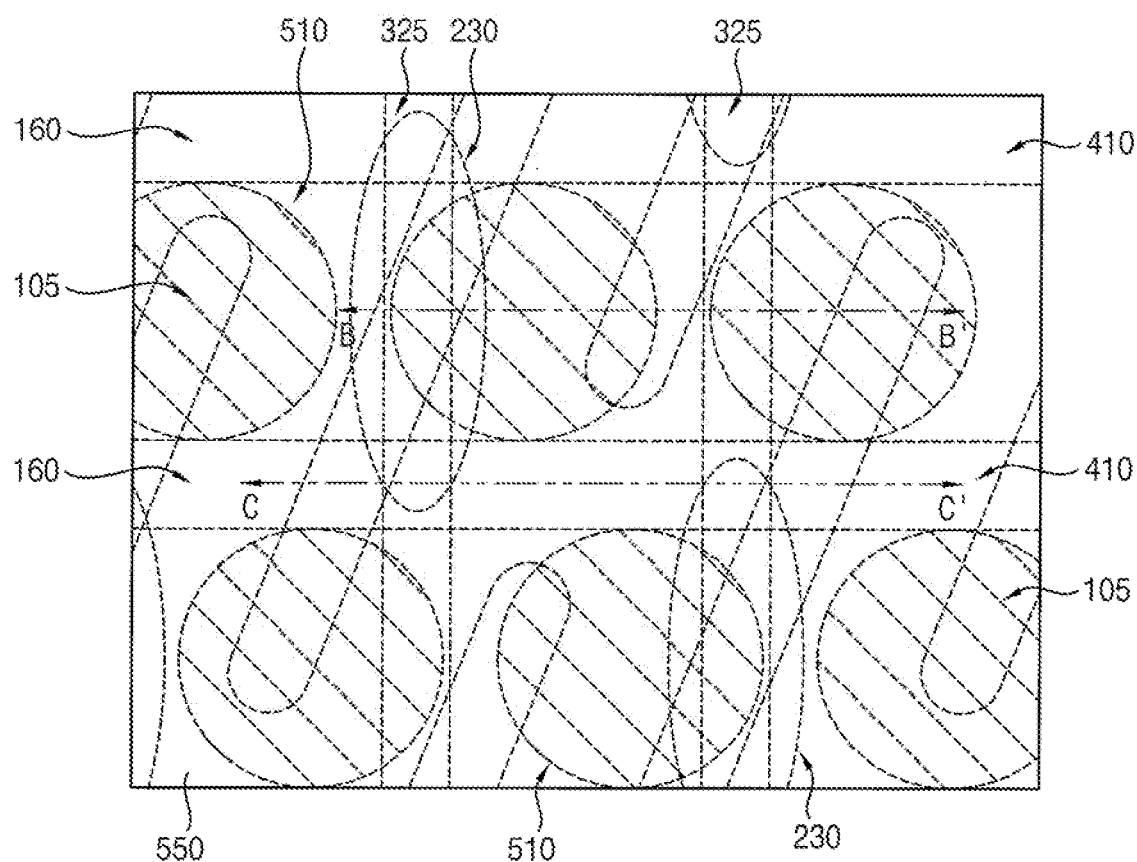
FIGS. 9 and 10 are a plan view and a cross-sectional view illustrating a semiconductor device in accordance with example embodiments.
Figure 9:
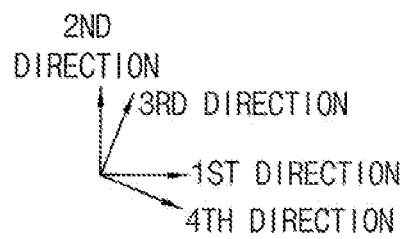
Figure 10:
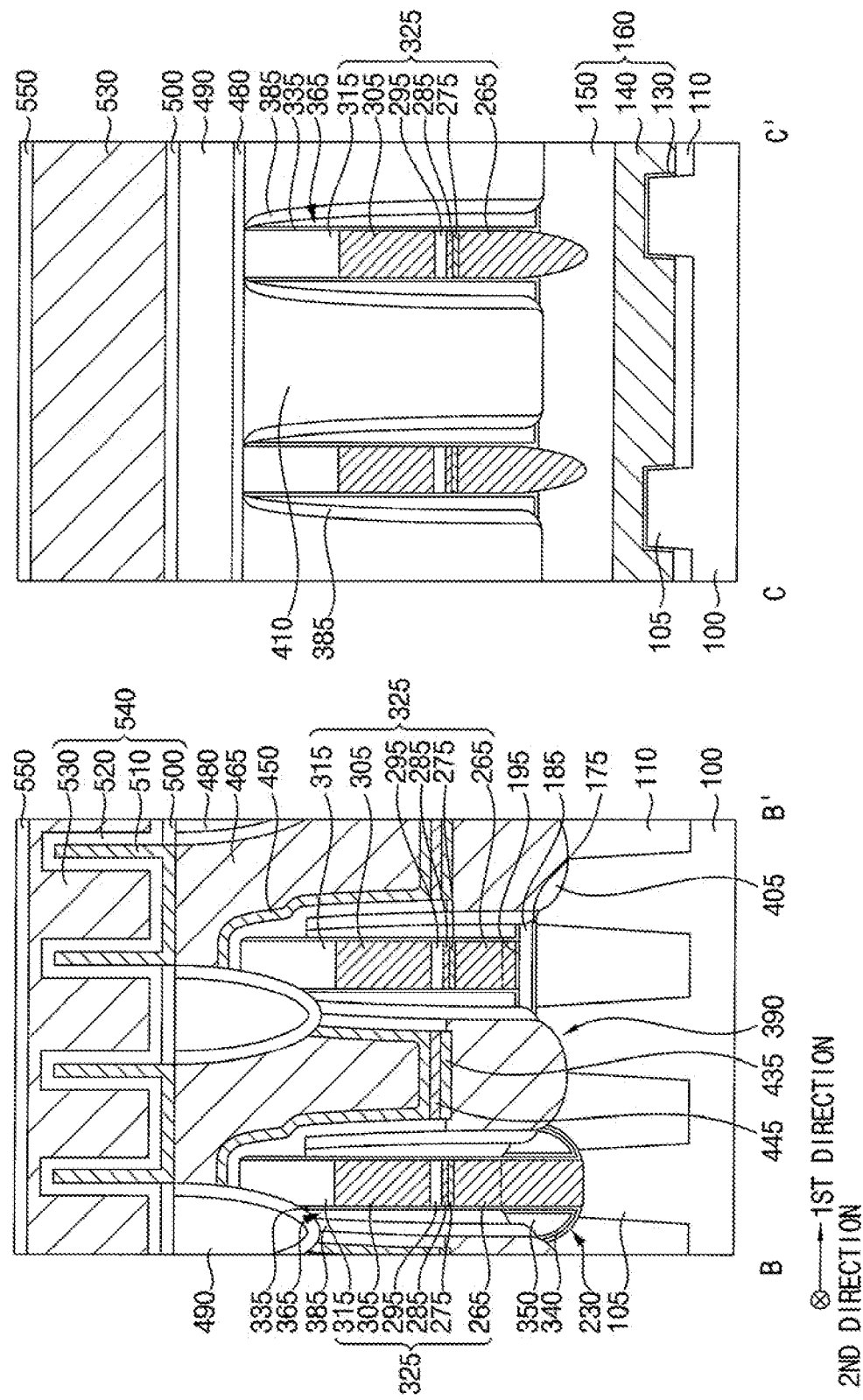

FIGS. 9 and 10 are a plan view and a cross-sectional view illustrating a semiconductor device in accordance with example embodiments. This semiconductor device may be a dynamic random access memory (DRAM) device to which the wiring structure of FIG. 1 is applied, and repeated explanations are omitted herein.

Two directions substantially parallel to an upper surface of a substrate 100 and substantially perpendicular to each other may be referred to as first and second directions, respectively, a direction substantially parallel to the upper surface of the substrate 100 and having an acute angle with respect to the first and second directions may be referred to as a third direction, and a direction substantially parallel to the upper surface of the substrate 100 and substantially perpendicular to the third direction may be referred to as a fourth direction.

Referring to FIGS. 9 and 10, the semiconductor device may include a gate structure 160, a bit line structure 325, a contact plug structure, and a capacitor 540. Additionally, the semiconductor device may include a spacer structure, a second capping pattern 410, first to fifth insulation patterns 175, 185, 195, 340, and 350, an etch stop layer 500, and first to third insulating interlayers 480, 490, and 550.

An isolation pattern 110 may be formed on the substrate 100. An active pattern 105 (of which a sidewall is covered by the isolation pattern 110) may be defined on the substrate 100. The isolation pattern 110 may include an oxide, e.g., silicon oxide.

In example embodiments, a plurality of active patterns 105 may be spaced apart from each other in each of the first and second directions. Each of the active patterns 105 may extend in the third direction to a certain length.

The gate structure 160 may extend in the first direction through upper portions of the active pattern 105 and the isolation pattern 110. A plurality of gate structures 160 may be spaced apart from each other in the second direction. Thus, the gate structure 160 may be buried at upper portions of the active pattern 105 and the isolation pattern 110. The gate structure 160 may include a gate insulation layer 130, a gate electrode 140, and a gate mask 150 sequentially stacked in a vertical direction substantially perpendicular to the upper surface of the substrate 100.

The gate insulation layer 130 may be formed on a surface of the active pattern 105. The gate electrode 140 may extend in the first direction on the gate insulation layer 130 and the isolation pattern 110. The gate mask 150 may cover an upper surface of the gate electrode 140.

The gate insulation layer 130 may include an oxide, e.g., silicon oxide. The gate electrode 140 may include a metal, e.g., tungsten, titanium, tantalum, etc., or a metal nitride, e.g., tungsten nitride, titanium nitride, tantalum nitride, etc. The gate mask 150 may include a nitride, e.g., silicon nitride.

In example embodiments, the bit line structure 325 may extend in the second direction on the active pattern 105, the isolation pattern 110, and the gate structure 160. A plurality of bit line structures 325 may be spaced apart from each other in the first direction. Each of the bit line structures 325 may contact a central portion in the third direction of an upper surface of the active pattern 105.

The bit line structure 325 may include a conductive structure 265, a first ohmic contact pattern 275, a first oxidation prevention pattern 285, a first diffusion barrier 295, a sixth conductive pattern 305 sequentially stacked in a vertical direction substantially perpendicular to the upper surface of the substrate 100. A first capping pattern 315 may be stacked on the conductive pattern 305. In example embodiments, the conductive structure 265, the first ohmic contact pattern 275, the first oxidation prevention pattern 285, the first diffusion barrier 295, the sixth conductive pattern 305, and the first capping pattern 315 included in the bit line structure 325 may include materials substantially the same as those of the first conductive pattern 25, the ohmic contact pattern 45, the oxidation prevention pattern 55, the diffusion barrier 65, the second conductive pattern 75, and the mask 85, respectively, described above in connection with FIG. 1.

As described above, the bit line structure 325 may include the first diffusion barrier containing graphene and having a relatively thin thickness, and thus may have enhanced diffusion barrier characteristics and a reduced thickness. Additionally, the bit line structure 325 may include the first ohmic contact pattern 275 and the first oxidation prevention pattern 285, and thus may have a reduced resistance.

Figure 16:
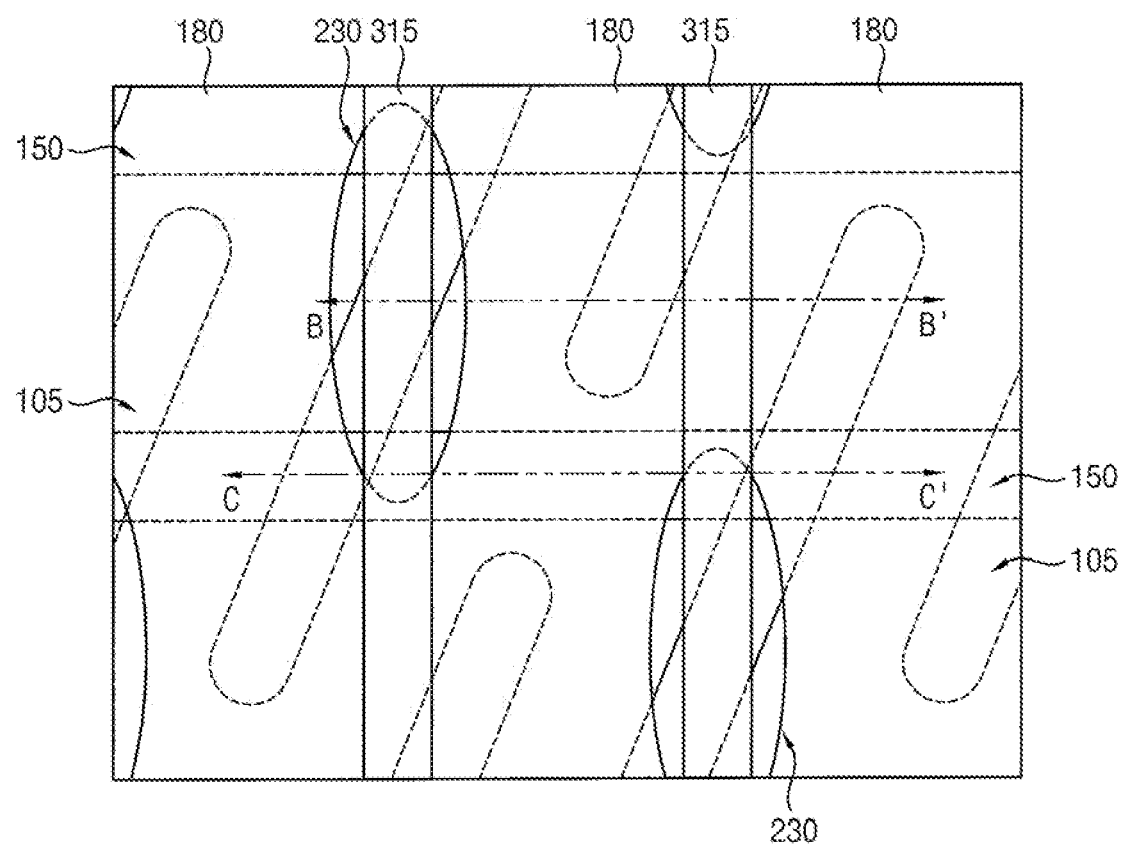
Figure 16:
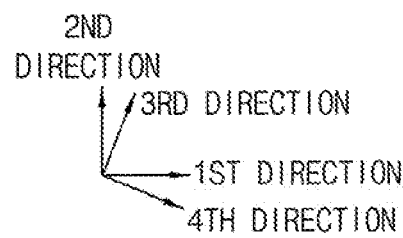
Figure 17:
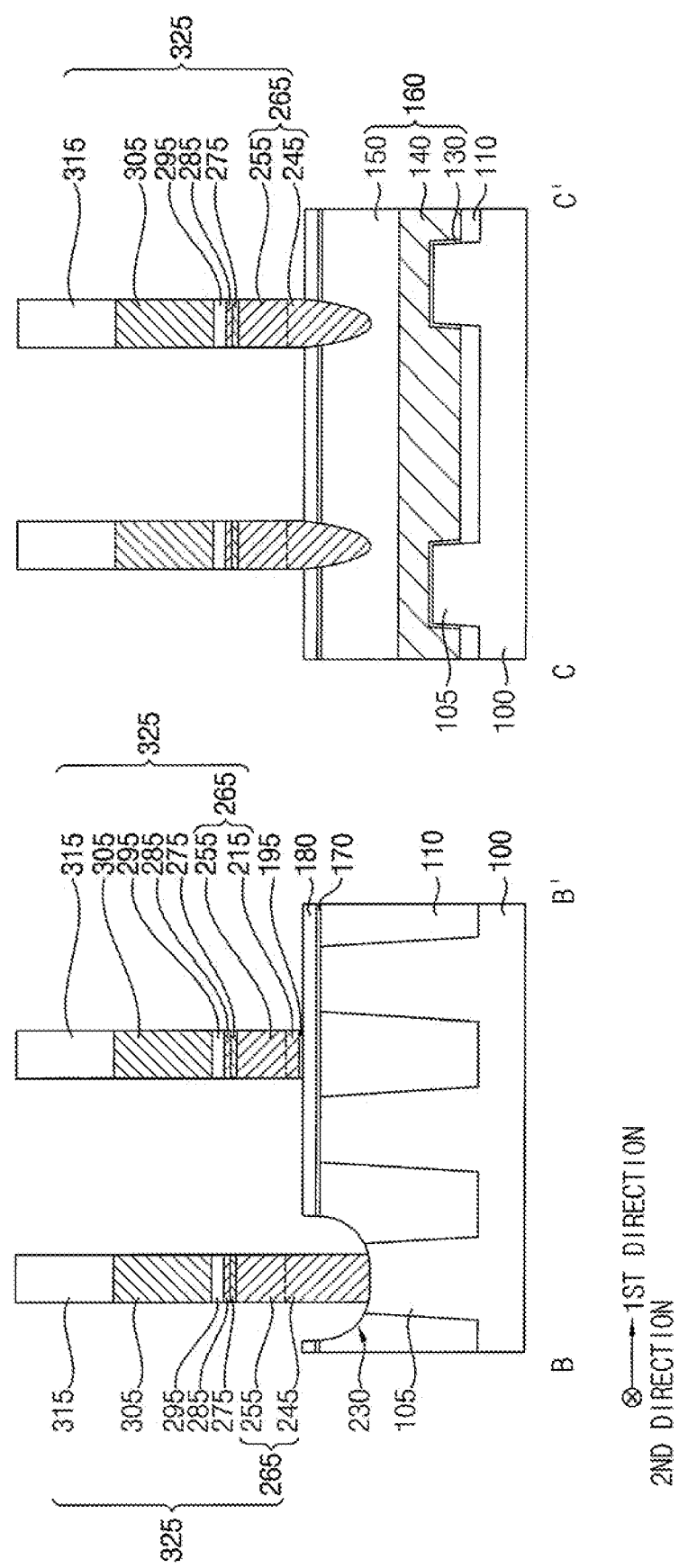

The conductive structure 265 may include fourth and fifth conductive patterns 245 and 255 sequentially stacked (refer to FIGS. 16 and 17) or third and fifth conductive patterns 215 and 255 sequentially stacked (refer to FIGS. 16 and 17). In example embodiments, a plurality of fourth conductive patterns 245 may be spaced apart from each other in each of the first and second directions. Thus, each of the fourth conductive patterns 245 may be formed in a second recess 230 on an upper surface of the active pattern 105 and upper surfaces of the isolation pattern 110 and the gate mask 150 adjacent thereto. The third conductive pattern 215 may be formed at an outside of the second recess 230.

The fifth conductive pattern 255 may extend in the second direction on the third and fourth conductive patterns 215 and 245 disposed in the second direction. The fifth conductive pattern 255 may include a material substantially the same as that of the third and fourth conductive patterns 215 and 245, e.g., polysilicon doped with impurities, and may be merged with the third and fourth conductive patterns 215 and 245.

Each of the first ohmic contact pattern 275, the first oxidation prevention pattern 285, the first diffusion barrier 295, the sixth conductive pattern 305, and the first capping pattern 315 may extend in the second direction on the fifth conductive pattern 255.

The spacer structure may be formed on each of opposite sidewalls of the bit line structure 325, and thus may extend in the second direction. The spacer structure may include a first spacer 335, an air spacer 365, a third spacer 385, and a fourth spacer 425 sequentially stacked in the first direction on each of opposite sidewalls of the bit line structure.

The first spacer 335 may contact a sidewall of the bit line structure 325 in the first direction. The air spacer 365 may contact a portion of an outer sidewall of the first spacer 335. The third spacer 385 may contact an outer sidewall of the air spacer 365. The fourth spacer 425 may contact an upper surface of the first capping pattern 315, an upper surface and an upper outer sidewall of the first spacer 335, an upper surface of the air spacer 365, and an upper surface and an upper outer sidewall of the third spacer 385. However, in an area where the sidewall of the bit line structure 325 in the first direction is surrounded by the second capping pattern 410, the air spacer 365 and the third spacer 385 may be sequentially stacked in the first direction on the outer sidewall of the first spacer 335, and the fourth spacer 425 may not be formed.

In example embodiments, uppermost surfaces of the air spacer 365 and the third spacer 385 may be lower than an uppermost surface of the first spacer 335, and may be higher than an upper surface of the sixth conductive pattern 305 of the bit line structure 325.

Each of the first, third, and fourth spacers 335, 385, and 425 may include a nitride, e.g., silicon nitride. The air spacer 365 may include air.

A sidewall of a portion of the bit line structure 325 in the second recess 230 and a bottom of the second recess 230 may be covered by the first spacer 335. The fourth insulation pattern 340 may be formed on a portion of the first spacer 335 in the second recess 230, and the fifth insulation pattern 350 may be formed on the fourth insulation pattern 340 to fill a remaining portion of the second recess 230. In example embodiments, the air spacer 365 may contact upper surfaces of the fourth and fifth insulation patterns 340 and 350, and the third spacer 385 may contact an upper surface of the fifth insulation pattern 350.

An insulation pattern structure (including the first to third insulation patterns 175, 185, and 195 sequentially stacked in the vertical direction) may be formed between the bit line structure 325 and portions of the active pattern 105 and the isolation pattern 110 at an outside of the second recess 230. The second insulation pattern 185 may contact a lower surface of the first spacer 335 having a cross-section of an "L" shape. The third insulation pattern 195 may contact a lower surface of the bit line structure 325.

Each of the first, third, and fifth insulation patterns 175, 195, and 350 may include a nitride, e.g., silicon nitride. Each of the second and fourth insulation patterns 185 and 340 may include an oxide, e.g., silicon oxide.

The second capping pattern 410 may extend in the first direction to overlap the gate structure 160 in the vertical direction, and may partially cover an outer sidewall of the spacer structure on the sidewall of the bit line structure 325 in the first direction. In example embodiments, a plurality of second capping patterns 410 may be spaced apart from each other in the second direction. The second capping pattern 410 may include a nitride, e.g., silicon nitride.

The contact plug structure may include a lower contact plug 405, second and third ohmic contact patterns 435 and 445, a second diffusion barrier layer 450, and an upper contact plug 465 sequentially stacked in the vertical direction.

The lower contact plug 405 may be formed on the third recess 390 on the active pattern 105 and the isolation pattern 110 between the bit line structures 325 neighboring in the first direction, and between the second capping patterns 410 neighboring in the second direction, and may contact an outer sidewall of the third spacer 385 of the spacer structure and a sidewall of each of the second capping patterns 410. Thus, a plurality of lower contact plugs 405 may be formed to be spaced apart from each other in each of the first and second directions. In an example embodiment, an uppermost surface of the lower contact plug 405 may be lower than uppermost surfaces of the air spacer 365 and the third spacer 385.

The lower contact plug 405 may include polysilicon doped with impurities. An air gap (not shown) may be formed in the lower contact plug 405.

The second ohmic contact pattern 435 may be formed on the lower contact plug 405. The second ohmic contact pattern 435 may include, e.g., cobalt silicide, nickel silicide, etc.

The third ohmic contact pattern 445 may be formed on the second ohmic contact pattern 435. The third ohmic contact pattern 445 may include, e.g., titanium silicide, tantalum silicide, tungsten silicide, etc.

The second diffusion barrier layer 450 may be formed on an upper surface of the third ohmic contact pattern 445 and a sidewall and an upper surface of the fourth spacer 425. The second diffusion barrier layer 450 may include, e.g., titanium nitride, tantalum nitride, tungsten nitride, etc.

The upper contact plug 465 may be formed on the second diffusion barrier layer 450. An upper surface of the upper contact plug 465 may be higher than upper surfaces of the bit line structure 325 and the second capping pattern 410.

In example embodiments, a plurality of upper contact plugs 465 may be formed in each of the first and second directions, and may be spaced apart from each other by the first and second insulating interlayers 480 and 490 sequentially stacked. The first insulating interlayer 480 may partially penetrate through an upper portion of the first capping pattern 315 of the bit line structure 325 and an upper portion of the spacer structure on the sidewall of the bit line structure 325. The first insulating interlayer 480 may include an insulation material having low gap-filling characteristics. The second insulating interlayer 490 may include a nitride, e.g., silicon nitride.

In example embodiments, the upper contact plugs 465 may be arranged in a honeycomb pattern in a plan view. Each of the upper contact plugs 465 may have a shape of a circle, an ellipse, or a polygon in a plan view. The upper contact plug 465 may include a low resistance metal, e.g., tungsten, aluminum, copper, etc.

The capacitor 540 may include a lower electrode 510, a dielectric layer 520, and an upper electrode 530 sequentially stacked on the upper contact plug 465. The lower and upper electrodes 510 and 530 may include the same material, e.g., doped polysilicon and/or a metal. The dielectric layer 520 may include silicon oxide, a metal oxide, and/or a nitride such as silicon nitride or a metal nitride where the metal may include, e.g., aluminum, zirconium, titanium, hafnium, etc.

The etch stop layer 500 may be formed between the dielectric layer 520 and the first and second insulating interlayers 480 and 490, and may include a nitride, e.g., silicon nitride.

The third insulating interlayer 550 may be formed on the first and second insulating interlayers 480 and 490, and may cover the capacitor 540. The third insulating interlayer 550 may include an oxide, e.g., silicon oxide.

FIGS. 11 to 25 are plan views and cross-sectional views illustrating a method of manufacturing a semiconductor device according to example embodiments. Specifically, FIGS. 11, 13, 16, and 20 are the plan views, and each of FIGS. 12, 14-15, 17-19, and 21-25 includes cross-sections taken along lines B-B' and C-C' of a corresponding plan view.

The present example embodiment is an application of the method of forming the wiring structure illustrated with reference to FIGS. 2 to 5 and FIG. 1 to a method of manufacturing a dynamic random access memory (DRAM) device, and repeated descriptions on the method of forming the wiring structure are omitted herein.

Figure 11:
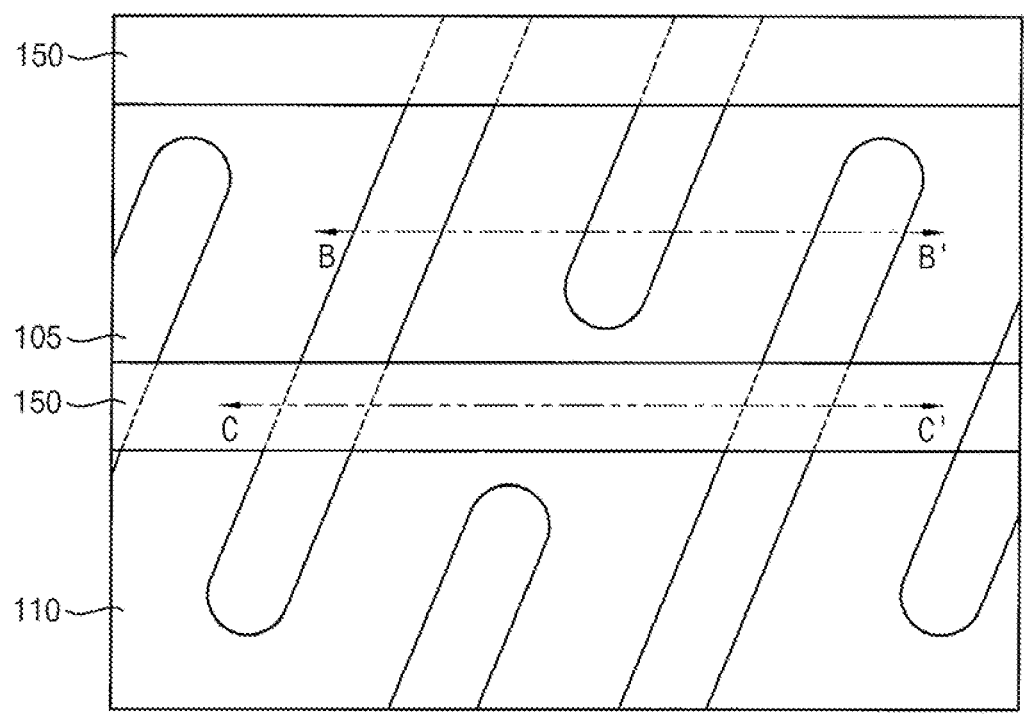
FIGS. 11 to 25 are plan views and cross-sectional views illustrating a method of manufacturing a semiconductor device according to example embodiments.
Figure 11:
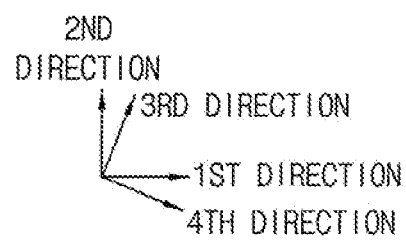
Figure 12:
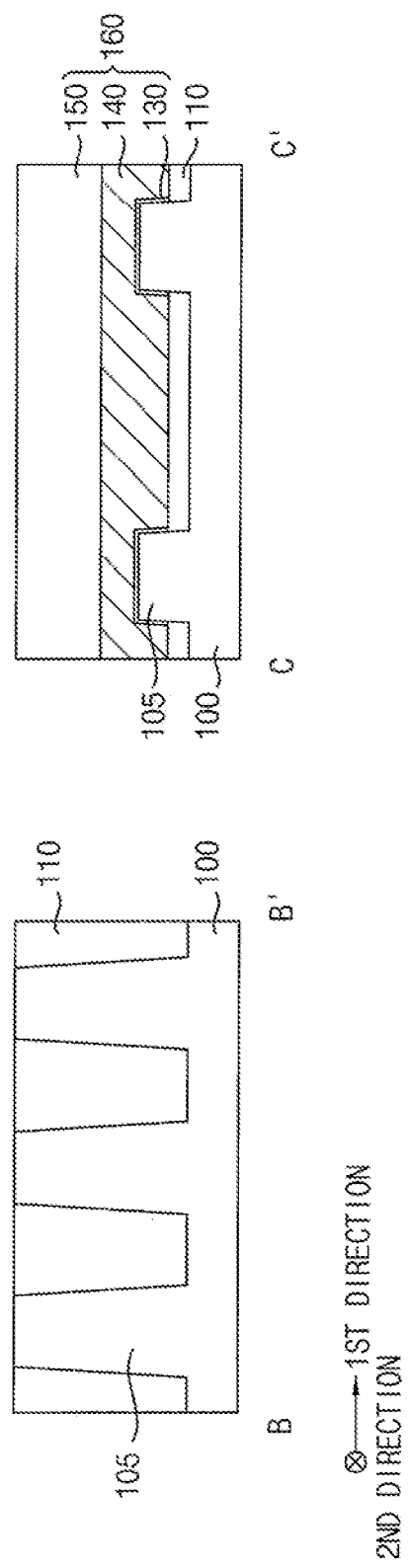

Referring to FIGS. 11 and 12, active patterns 105 may be formed on a substrate 100. An isolation pattern 110 may be formed to cover sidewalls of the active patterns 105.

An ion implantation process may be performed on the substrate 100 to form an impurity region (not shown), and the active pattern 105 and the isolation pattern 110 may be partially etched to form a first recess extending in the first direction.

A gate structure 160 may be formed in the first recess. The gate structure 160 may include a gate insulation layer 130 on a surface of the active pattern 105 exposed by the first recess, a gate electrode 140 on the gate insulation layer 130 to fill a lower portion of the first recess, and a gate mask 150 on the gate electrode 140 to fill an upper portion of the first recess. The gate structure 160 may extend in the first direction, and a plurality of gate structures 160 may be spaced apart from each other in the second direction.

The gate insulation layer 130 may be formed by performing a thermal oxidation process on the surface of the active pattern 105 exposed by the first recess.

Figure 13:
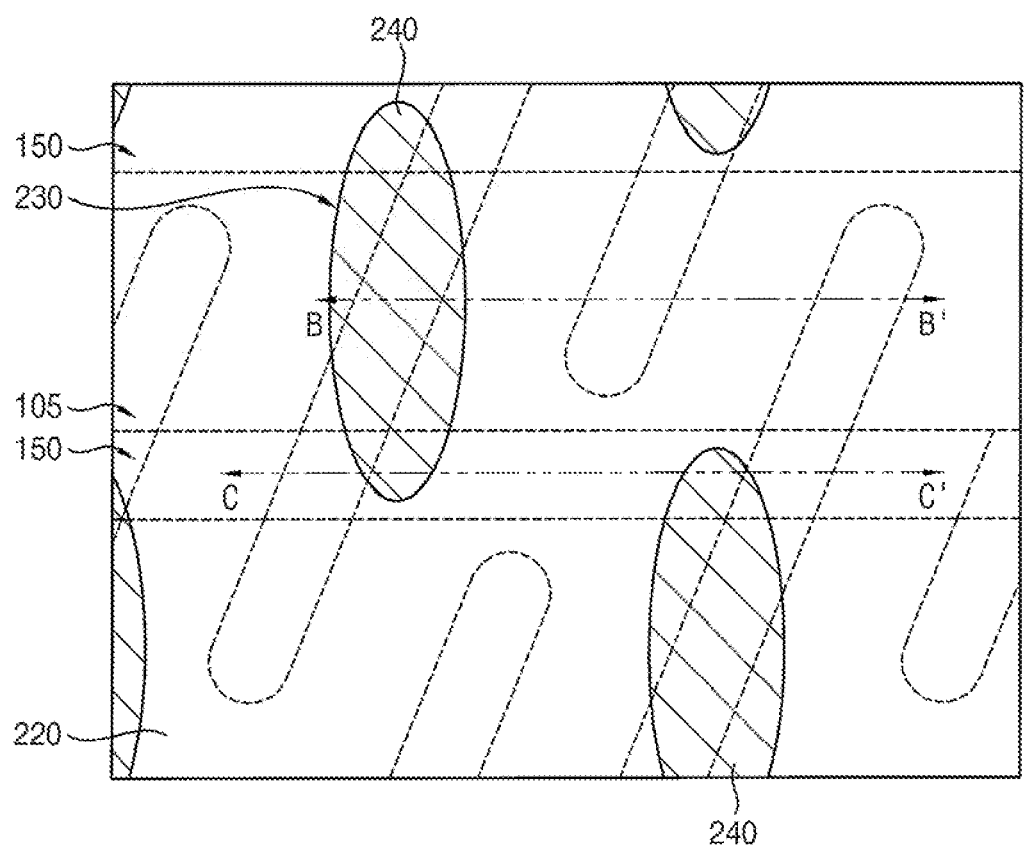
Figure 13:
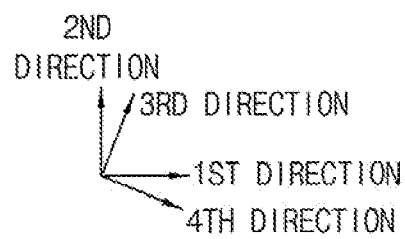
Figure 14:
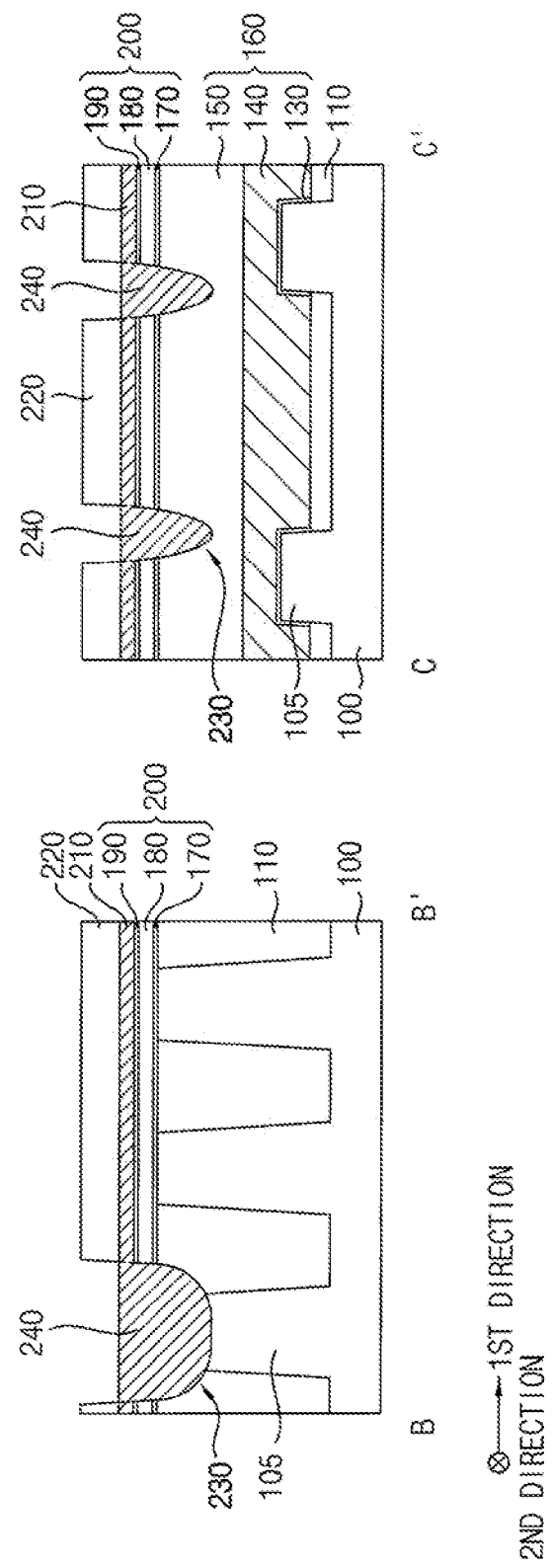

Referring to FIGS. 13 and 14, an insulation layer structure 200, a third conductive layer 210, and a first mask 220 may be sequentially formed on the substrate 100. The third conductive layer 210 and the insulation layer structure 200 may be etched using the first mask 220 as an etching mask to form a first hole 230 exposing the active pattern 105. The first hole 230 may correspond to the second recess 230 of FIG. 1.

In example embodiments, the insulation layer structure 200 may include first, second, and third insulation layers 170, 180, and 190 sequentially stacked. Each of the first and third insulation layers 170 and 190 may include an oxide, e.g., silicon oxide, and the second insulation layer 180 may include a nitride, e.g., silicon nitride.

The third conductive layer 210 may include, e.g., doped polysilicon. The first mask 220 may include a nitride, e.g., silicon nitride.

During the etching process, upper portions of the active pattern 105 and the isolation pattern 110 adjacent thereto exposed by the first hole 230, and an upper portion of the gate mask 150 may be also etched to form a second recess. Thus, a bottom of the first hole 230 may be referred to as a second recess.

In example embodiments, the first hole 230 may expose a central upper surface of each of the active patterns 105 extending in the third direction. A plurality of first holes 230 may be formed in each of the first and second directions.

A fourth conductive layer 240 may be formed to fill the first hole 230.

In example embodiments, the fourth conductive layer 240 may be formed by forming a preliminary fourth conductive layer on the active pattern 105, the isolation pattern 110, the gate mask 150, and the first mask 220 to fill the first hole 230, and then removing an upper portion of the preliminary fourth conductive layer through, e.g., a CMP process and/or an etch back process. Thus, the fourth conductive layer 240 may have an upper surface substantially coplanar with an upper surface of the third conductive layer 210.

In example embodiments, a plurality of fourth conductive layers 240 may be spaced apart from each other in each of the first and second directions. The fourth conductive layer 240 may include, for example, doped polysilicon, and may be merged to the third conductive layer 210.

Figure 15:
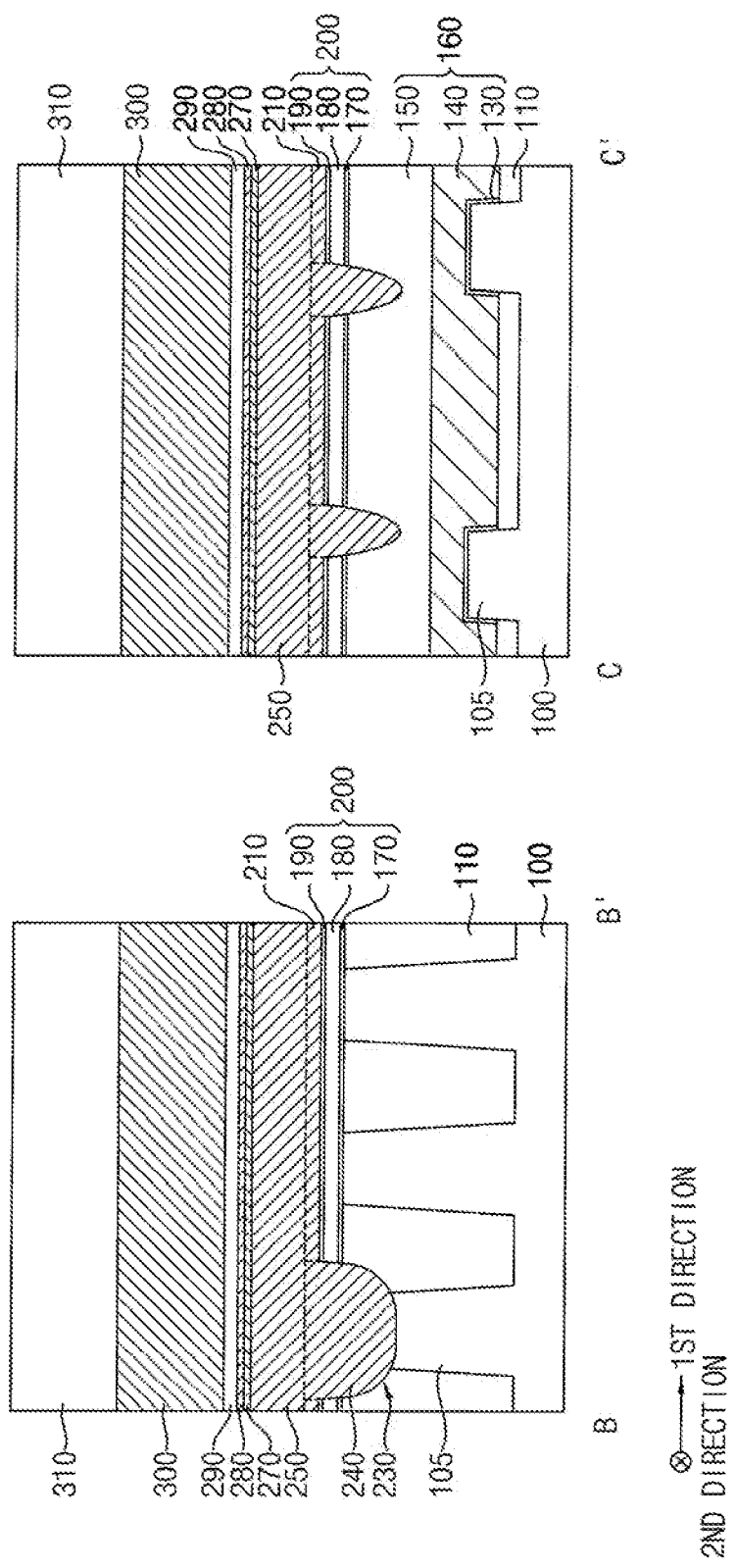

Referring to FIG. 15, the first mask 220 may be removed. Then, a fifth conductive layer 250, a first ohmic contact layer 270, a first oxidation prevention layer 280, a first diffusion barrier layer 290, a sixth conductive layer 300, and a first capping layer 310 may be sequentially formed on the third and fourth conductive layers 210 and 240.

In example embodiments, the fifth conductive layer 250, the first ohmic contact layer 270, the first oxidation prevention layer 280, the first diffusion barrier layer 290, and the sixth conductive layer 300 may be formed by the same processes to include the same materials as the first conductive layer 20, the ohmic contact layer 40, the oxidation prevention layer 50, the diffusion barrier layer 60, and the second conductive layer 70, respectively, described in connection with reference to FIGS. 2 to 5. Additionally, the first capping layer 310 may include a material substantially the same as that of the mask 85 described in connection with FIG. 1.

Accordingly, the fifth conductive layer 250 may include doped polysilicon, and may be merged with the third and fourth conductive layers 210 and 240.

Referring to FIGS. 16 and 17, the first capping layer 310 may be patterned to form a first capping pattern 315. Then, the sixth conductive layer 300, the first diffusion barrier layer 290, the first oxidation prevention layer 280, the first ohmic contact layer 270, the fifth conductive layer 250, the third and fourth conductive layers 210 and 240, and the third insulation layer 190 may be sequentially etched using the first capping pattern 315 as an etching mask.

In example embodiments, the first capping pattern 315 may extend in the second direction on the substrate 100, and a plurality of first capping patterns 315 may be formed to be spaced apart from each other in the first direction.

By the etching process, a fourth conductive pattern 245, a fifth conductive pattern 255, a first ohmic contact pattern 275, a first oxidation prevention pattern 285, a first diffusion barrier 295, a sixth conductive pattern 305 sequentially stacked may be formed on the active pattern 105, the isolation pattern 110, and the gate mask 150 in the first hole 230. Also, a third insulation pattern 195, a third conductive pattern 215, the fifth conductive pattern 255, the first ohmic contact pattern 275, the first oxidation prevention pattern 285, the first diffusion barrier 295, the sixth conductive pattern 305, and the first capping pattern 315 may be sequentially stacked on the second insulation layer 180 of the insulation layer structure 200 at an outside of the first hole 230.

As described above, the third to fifth conductive layers 210, 240, and 250 may be merged with each other, and thus the fourth and fifth conductive patterns 245 and 255 sequentially stacked and the third and fifth conductive patterns 215 and 255 sequentially stacked may each form one conductive structure 265. Hereinafter, the conductive structure 265, the first ohmic contact pattern 275, the first oxidation prevention pattern 285, the first diffusion barrier 295, the sixth conductive pattern 305, and the first capping pattern 315 sequentially stacked may be referred to as a bit line structure 325.

In example embodiments, the bit line structure 325 may extend in the second direction on the substrate 100, and a plurality of bit line structures 325 may be spaced apart from each other in the first direction. Each of the bit line structures 325 may contact a central portion in the third direction of each of the active patterns 105 through the first hole 230, and thus may be electrically connected thereto.

Figure 18:
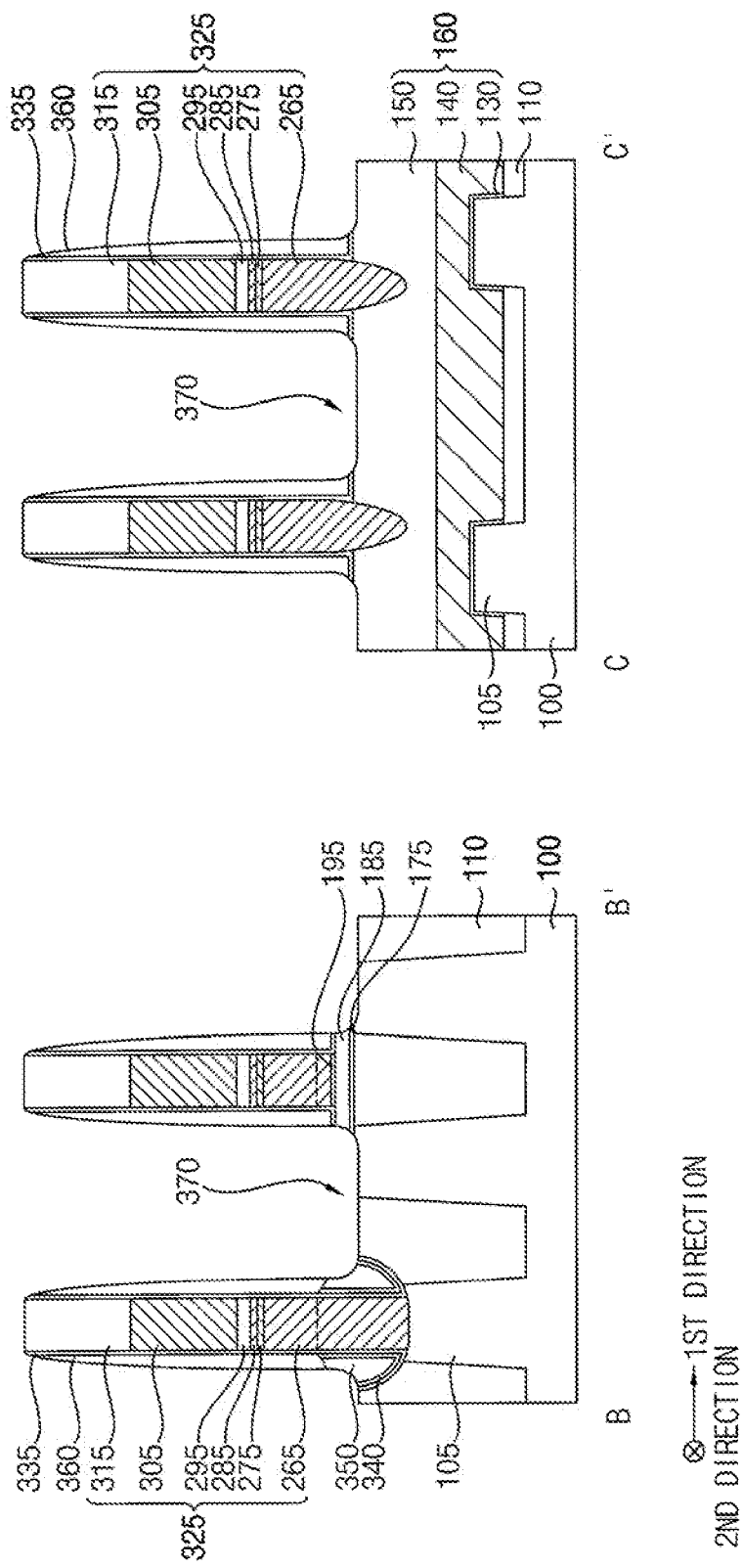

Referring to FIG. 18, a first spacer layer may be formed on upper surfaces of the active pattern 105, the isolation pattern 110 and the gate mask 150 exposed by the first hole 230, a sidewall of the first hole 230, and the second insulation layer 180 to cover the bit line structure 325. Fourth and fifth insulation layers may be sequentially formed on the first spacer layer.

The first spacer layer may also cover a sidewall of the third insulation pattern 195 between the second insulation layer 180 and the bit line structure 325. The fifth insulation layer may fill the first hole 230.

The fourth and fifth insulation layers may be etched by an etching process. In example embodiments, the etching process may be performed by a wet etch process, and other portions of the fourth and fifth insulation layers except for a portion in the first hole 230 may be removed. Thus, most of an entire surface of the first spacer layer, that is, an entire surface except for a portion thereof in the first hole 230 may be exposed, and portions of the fourth and fifth insulation layers remaining in the first hole 230 may form fourth and fifth insulation patterns 340 and 350, respectively.

A second spacer layer may be formed on the exposed surface of the first spacer layer and the fourth and fifth insulation patterns 340 and 350 in the first hole 230. The second spacer layer may be anisotropically etched to form a second spacer 360 on the surface of the first spacer layer and the fourth and fifth insulation patterns 340 and 350 to cover a sidewall of the bit line structure 325.

A dry etching process may be performed using the first capping pattern 315 and the second spacer 360 as an etching mask to form a first opening 370 exposing the upper surface of the active pattern 105. The upper surface of the isolation pattern 110 and the upper surface of the gate mask 150 may be also exposed by the first opening 370.

By the dry etching process, portions of the first spacer layer on upper surfaces of the first capping pattern 315 and the second insulation layer 180 may be removed, and thus a first spacer 335 covering the sidewall of the bit line structure 325 may be formed. Additionally, during the dry etching process, the first and second insulation layers 170 and 180 may be partially removed, such that first and second insulation patterns 175 and 185 may remain under the bit line structure 325. The first to third insulation patterns 175, 185, and 195 that are sequentially stacked under the bit line structure 325 may form an insulation pattern structure.

Figure 19:
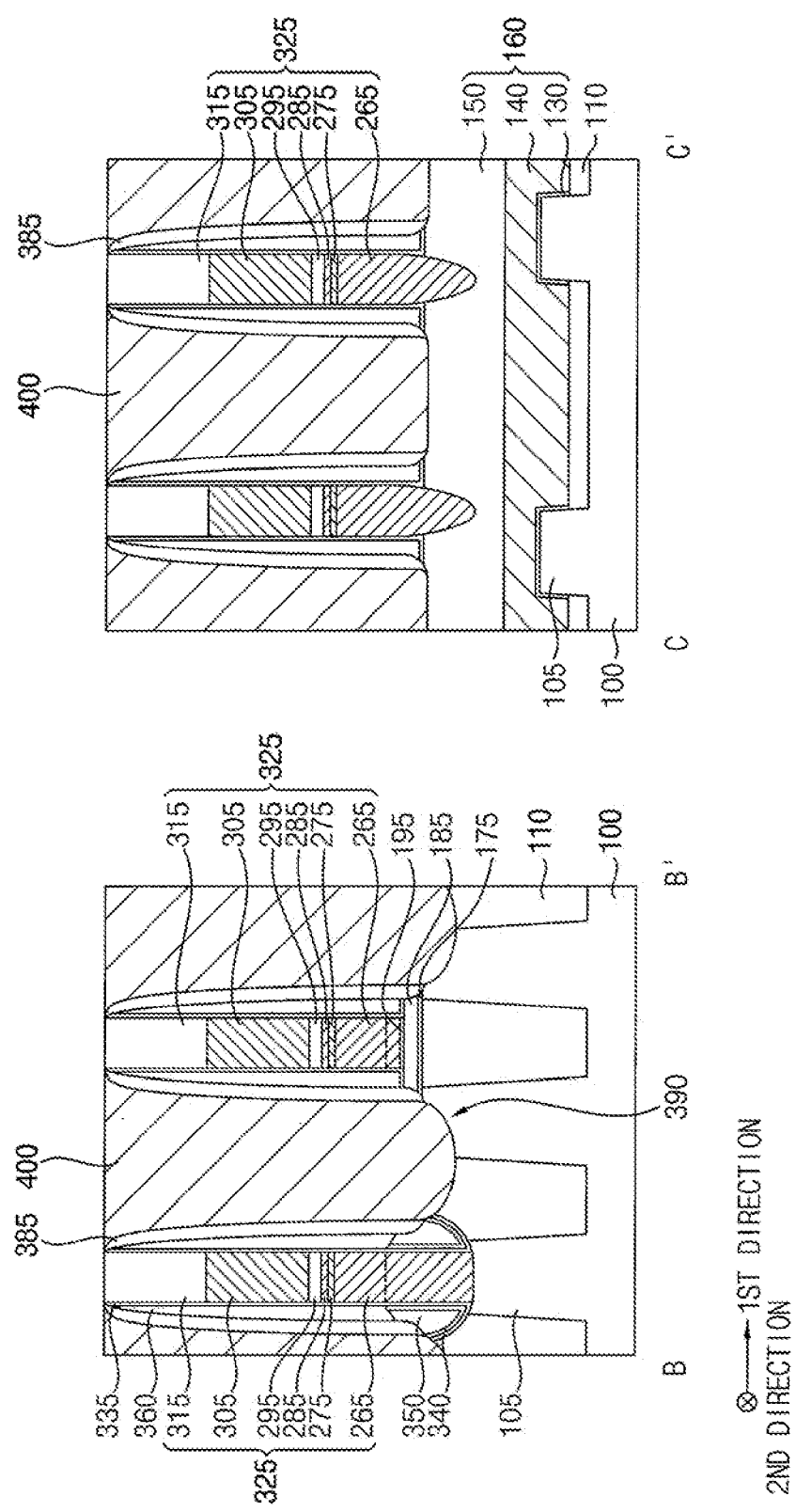

Referring to FIG. 19, a third spacer layer may be formed on the upper surface of the first capping pattern 315, an outer sidewall of the second spacer 360, portions of upper surfaces of the fourth and fifth insulation patterns 340 and 350, and the upper surfaces of the active pattern 105, the isolation pattern 110, and the gate mask 150 exposed by the first opening 370. The third spacer layer may be anisotropically etched to form a third spacer 385 covering the sidewall of the bit line structure 325.

The third spacer layer may include a nitride, e.g., silicon nitride.

The first to third spacers 335, 360, and 385, which are sequentially stacked in a horizontal direction substantially parallel to the upper surface of the substrate 100 from the sidewall of the bit line structure 325, may be referred to as a preliminary spacer structure.

An upper portion of the active pattern 105 may be removed by an etching process to form a third recess 390 connected to the first opening 370.

A lower contact plug layer 400 may be formed to fill the first opening 370 and the third recess 390 on the substrate 100. An upper portion of the lower contact plug layer 400 may be planarized until the upper surface of the first capping pattern 315 is exposed.

In example embodiments, the lower contact plug layer 400 may extend in the second direction. A plurality of lower contact plug layers 400 may be formed to be spaced apart from each other in the first direction by the bit line structures 325. The lower contact plug layer 400 may include, e.g., doped polysilicon.

Figure 20:
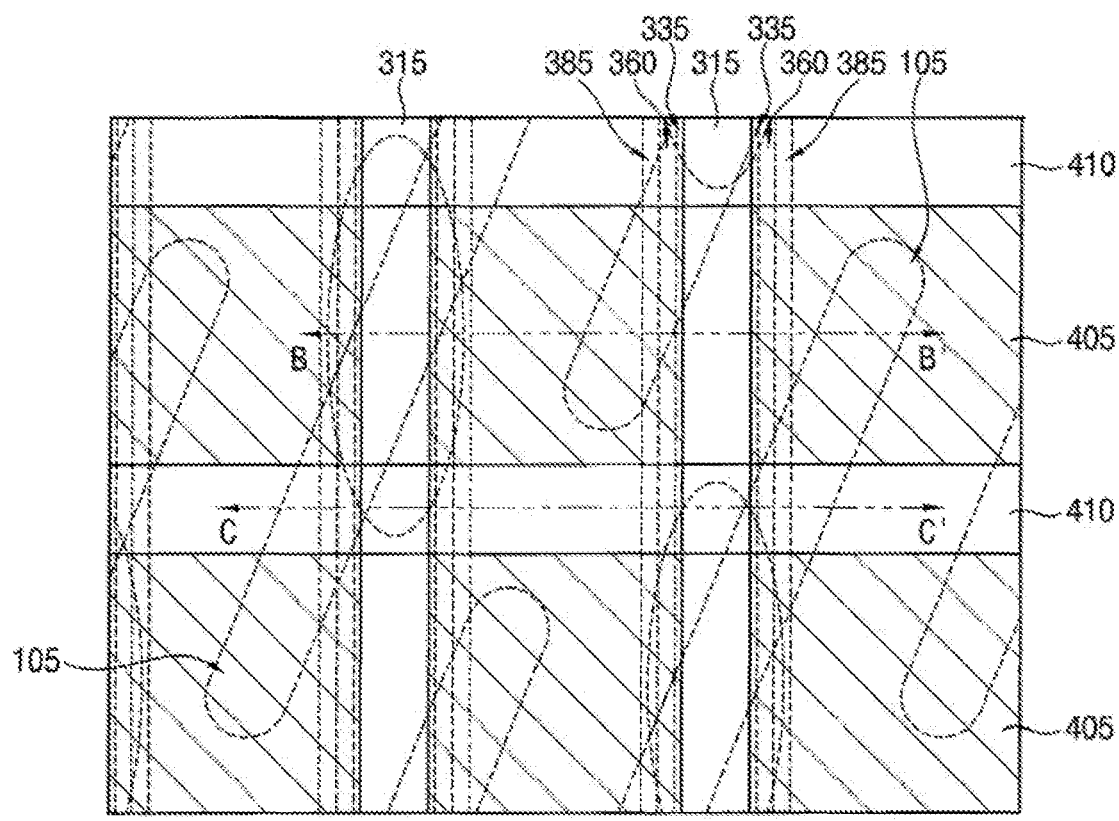
Figure 21:
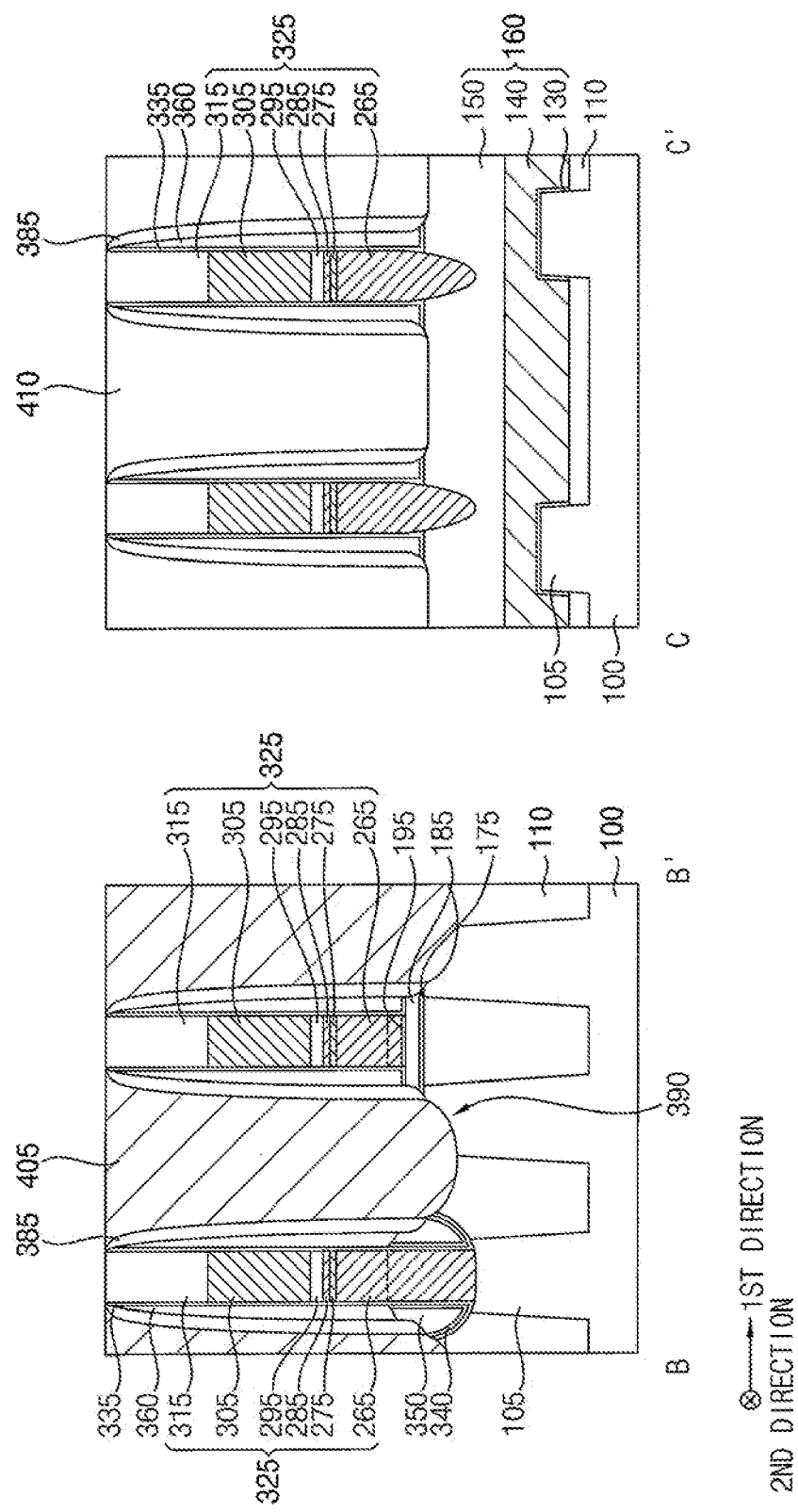

Referring to FIGS. 20 and 21, a second mask (not shown) including second openings (each of which may extend in the first direction, spaced apart from each other in the second direction) may be formed on the first capping pattern 315 and the lower contact plug layer 400. The lower contact plug layer 400 may be etched using the second mask as an etching mask.

In example embodiments, each of the second openings may overlap the gate structure 160 in a vertical direction substantially perpendicular to the upper surface of the substrate 100. By the etching process, a third opening may be formed to expose the upper surface of the gate mask 150 of the gate structure 160 between the bit line structures 325 on the substrate 100.

After removing the second mask, a second capping pattern 410 may be formed on the substrate 100 to fill the third opening. The second capping pattern 410 may include a nitride, e.g., silicon nitride. In example embodiments, the second capping pattern 410 may extend in the first direction between the bit line structures 325. A plurality of second capping patterns 410 may be formed in the second direction.

Thus, the lower contact plug layer 400 extending in the second direction between the bit line structures 325 may be divided into a plurality of lower contact plugs 405 spaced apart from each other in the second direction by the second capping patterns 410. Each of the lower contact plugs 405 may contact a corresponding one of opposite ends in the third direction of a corresponding one of the active patterns 105, and may be electrically connected thereto.

Figure 22:
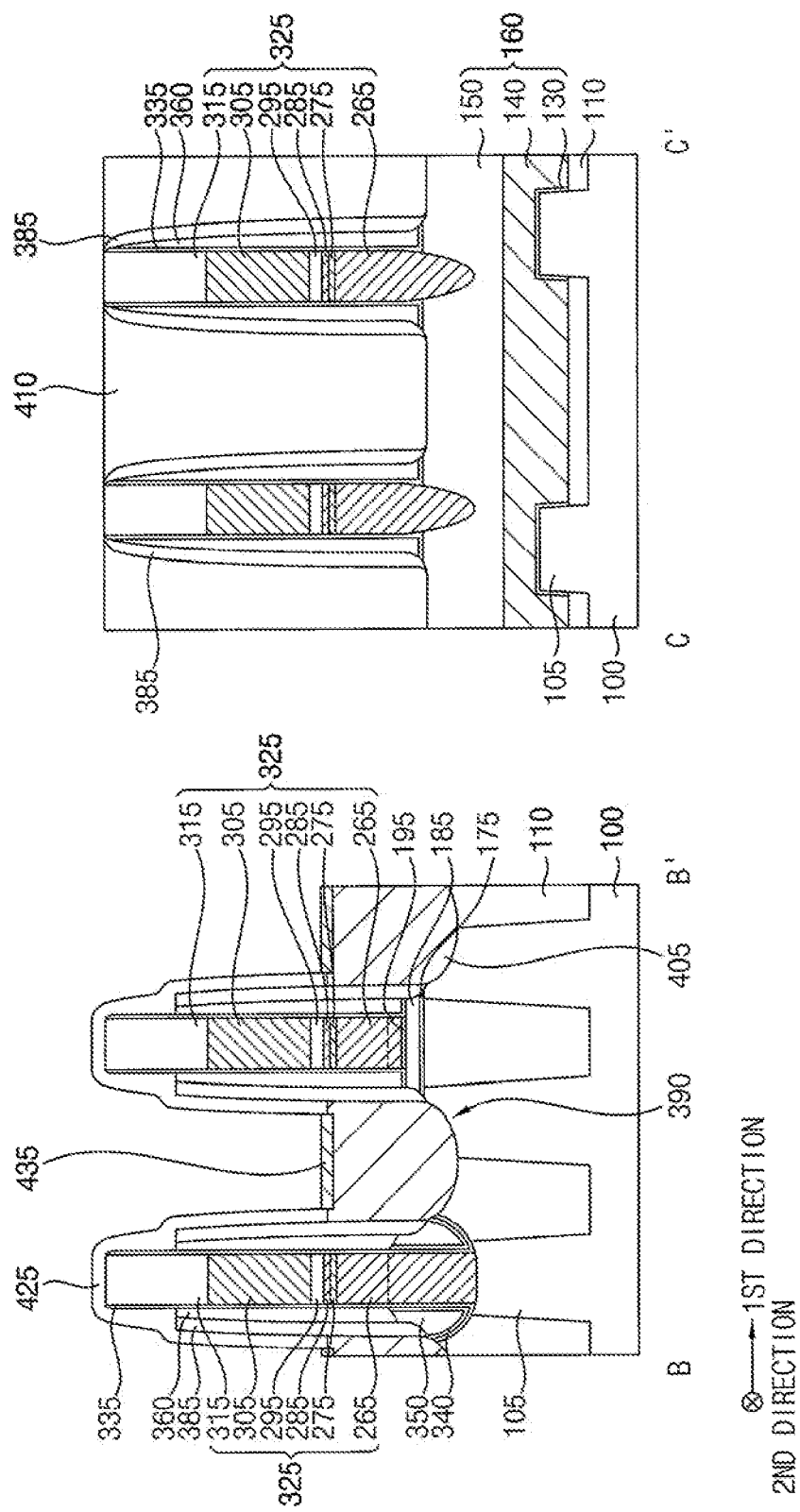

Referring to FIG. 22, an upper portion of the lower contact plug 405 may be removed to expose an upper portion of the preliminary spacer structure on the sidewall of the bit line structure 325. Upper portions of the second and third spacers 360 and 385 of the exposed preliminary spacer structure may be removed.

An upper portion of the lower contact plug 405 may be further removed by, e.g., an etch back process. Thus, the upper surface of the lower contact plug 405 may be lower than uppermost surfaces of the second and third spacers 360 and 385.

A fourth spacer layer may be formed on the bit line structure 325, the preliminary spacer structure, the second capping pattern 410, and the lower contact plug 405. The fourth spacer layer may be anisotropically etched so that a fourth spacer 425 covers the first to third spacers 335, 360, 385 on each of opposite sidewalls of the bit line structure 325 in the first direction, while an upper surface of the lower contact plug 405 may not be covered by the fourth spacer 425 but instead may be exposed.

A second ohmic contact pattern 435 may be formed on the exposed upper surface of the lower contact plug 405. In example embodiments, the second ohmic contact pattern 435 may be formed by forming a metal layer on the lower contact plug 405, the fourth spacer 425, and the first and second capping patterns 315 and 410, thermally treating the metal layer, and removing an unreacted portion of the metal layer. The second ohmic contact pattern 435 may include, e.g., cobalt silicide, nickel silicide, etc.

Figure 23:
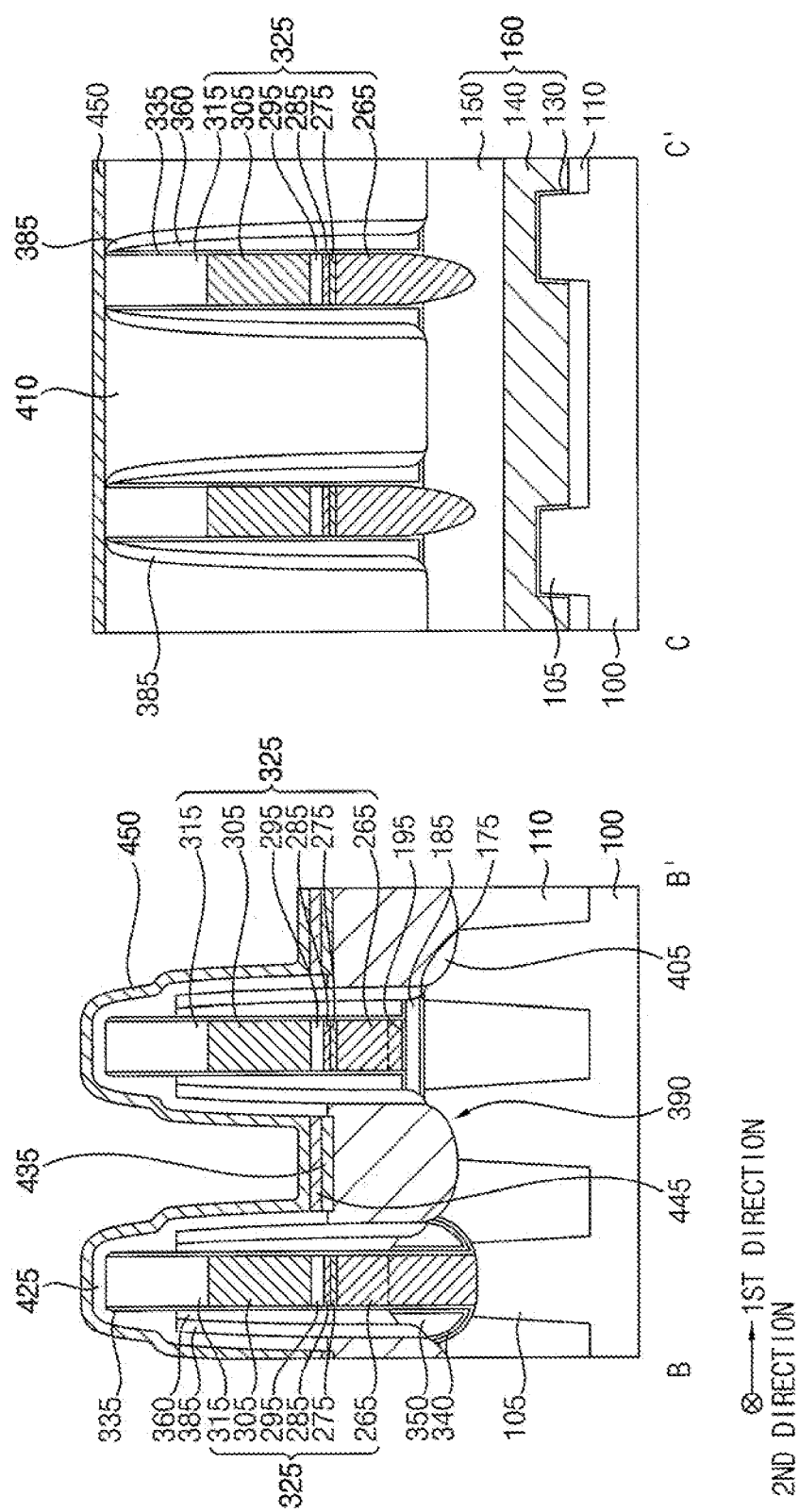

Referring to FIG. 23, for example, a third ohmic contact layer may be formed on the second ohmic contact pattern 435, the fourth spacer 425, and the first and second capping patterns 315 and 410. A third ohmic contact pattern 445 may be formed on a portion of the third ohmic contact layer contacting the second ohmic contact pattern 435.

In example embodiments, the third ohmic contact layer may include, e.g., titanium, and thus the third ohmic contact pattern 445 may include titanium silicide. In another implementation, the third ohmic contact layer may include, e.g., tantalum, tungsten, etc., and thus the third ohmic contact pattern 445 may include tantalum silicide, tungsten silicide, etc.

Then, the second diffusion barrier layer 450 may be formed on the third ohmic contact layer and the third ohmic contact pattern 445. The second diffusion barrier layer 450 may include, e.g., titanium nitride. When the second diffusion barrier layer 450 is formed, the third ohmic contact layer under the second diffusion barrier layer 450 may be nitridated to include titanium nitride. Accordingly, the third ohmic contact layer may be merged with the second diffusion barrier layer 450.

Figure 24:
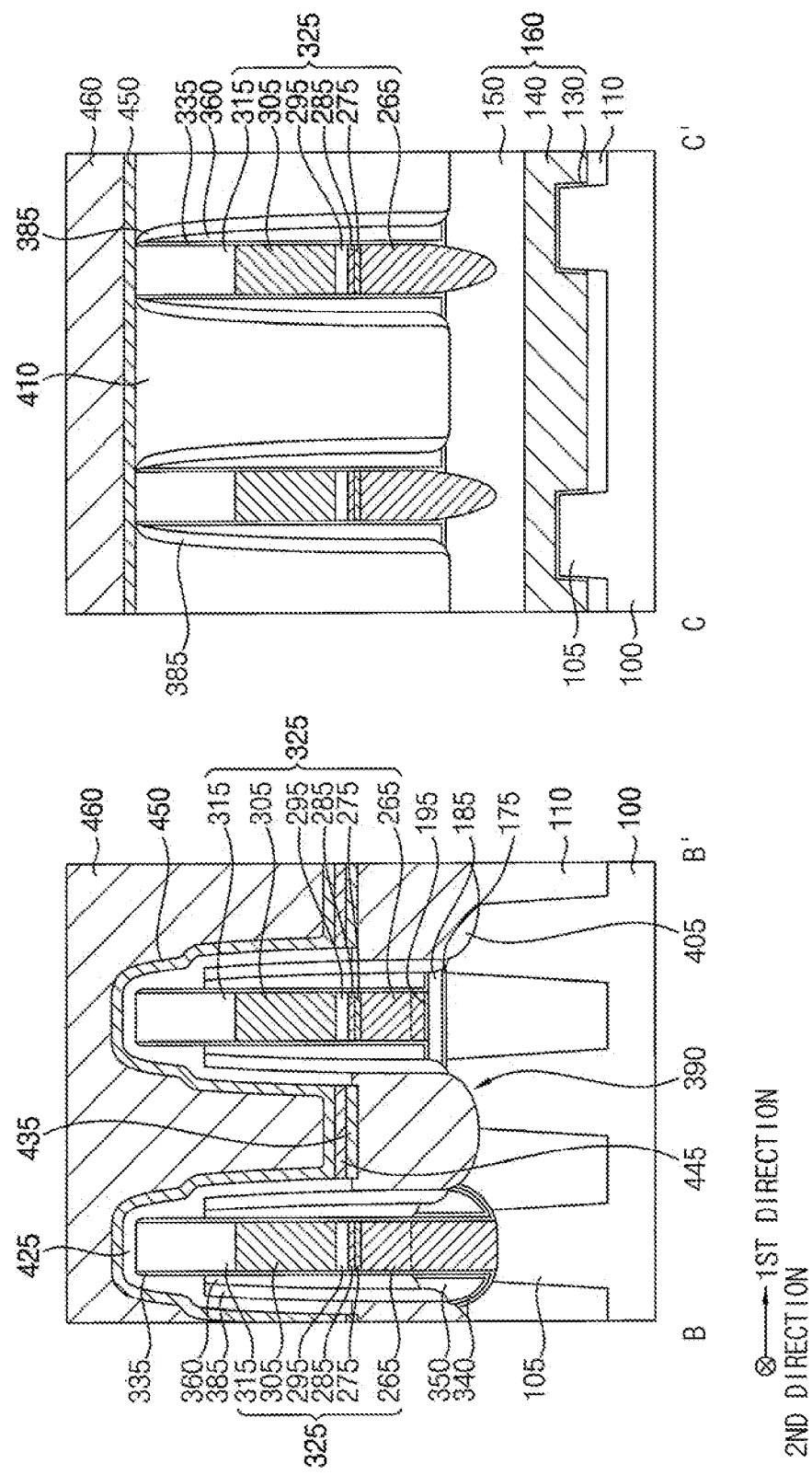

Referring to FIG. 24, an upper contact plug layer 460 may be formed on the second diffusion barrier layer 450. An upper portion of the upper contact plug layer 460 may be planarized.

In example embodiments, an upper surface of the upper contact plug layer 460 may be higher than upper surfaces of the first and second capping patterns 315 and 410.

Figure 25:
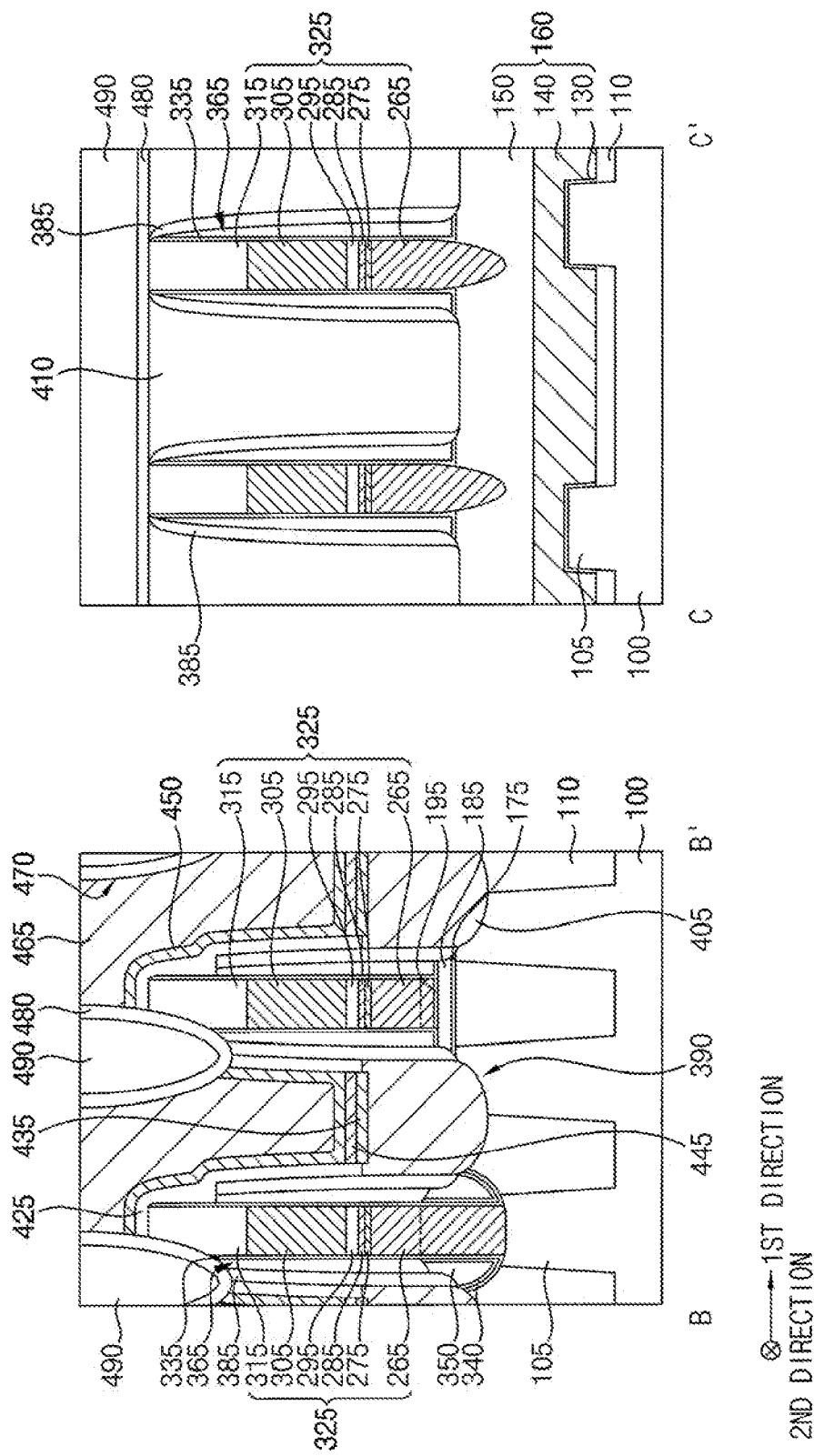

Referring to FIG. 25, an upper portion of the upper contact plug layer 460, a portion of the second diffusion barrier layer 450, an upper portion of the first capping pattern 315, and upper portions of the first, third, and fourth spacers 335, 385, and 425 may be removed to form a second hole 470. Thus, an upper surface of the second spacer 360 may be exposed.

As the second hole 470 is formed, the upper contact plug layer 460 may be transformed into an upper contact plug 465. In example embodiments, a plurality of upper contact plugs 465 may be formed to be spaced apart from each other in each of the first and second directions, and may be arranged in a honeycomb pattern in a plan view. Each of the upper contact plugs 465 may have a shape of a circle, ellipse, or polygon in a plan view.

The lower contact plug 405, the second and third ohmic contact patterns 435 and 445, and the upper contact plug 465 sequentially stacked on the substrate 100 may form a contact plug structure.

The exposed second spacer 360 may be removed to form an air gap 365 connected to the second hole 470. The air gap 365 may be also referred to as an air spacer 365. The second spacer 360 may be removed by, e.g., a wet etching process.

In example embodiments, a portion of the second spacer 360 on the sidewall of the bit line structure 325 extending in the second direction directly exposed by the second hole 470 may be removed, and other portions of the second spacer 360 parallel to the directly exposed portion thereof in the horizontal direction may also be removed. Thus, not only the portion of the second spacer 360 exposed by the second hole 470 not to be covered by the upper contact plug 465, but also a portion of the second spacer 360 adjacent to the exposed portion in the second direction to be covered by the second capping pattern 410 and a portion of the second spacer 360 adjacent to the exposed portion in the second direction to be covered by the upper contact plug 465 may all be removed.

First and second insulating interlayers 480 and 490 may be sequentially stacked to fill the second hole 470. The first and second insulating interlayers 480 and 490 may be also sequentially stacked on the second capping pattern 410.

The first insulating interlayer 480 may include a material having a low gap filling characteristic, and thus the air gap 365 under the second hole 470 may not be filled. The air gap 365 may be also referred to as an air spacer 365, and may form a spacer structure together with the first, third, and fourth spacers 335, 385, and 425. The air gap 365 may be a spacer including air.

Referring to FIGS. 9 and 10 again, a capacitor 540 may be formed to contact the upper surface of the upper contact plug 465.

For example, an etch stop layer 500 and a mold layer (not shown) may be sequentially formed on the upper contact plug 465 and the first and second insulating interlayers 480 and 490, and partially etched to form a third hole partially exposing the upper surface of the upper contact plug 465.

A lower electrode layer (not shown) may be formed on a sidewall of the third hole, the exposed upper surface of the upper contact plug 465, and the mold layer. A sacrificial layer (not shown) may be formed on the lower electrode layer to fill the third hole. The lower electrode layer and the sacrificial layer may be planarized until an upper surface of the mold layer is exposed to divide the lower electrode layer. The sacrificial layer and the mold layer may be removed by, e.g., a wet etching process. Thus, a lower electrode 510 having a cylindrical shape may be formed on the exposed upper surface of the upper contact plug 465. In another implementation, the lower electrode 510 may have a pillar shape filling the third hole.

A dielectric layer 520 may be formed on a surface of the lower electrode 510 and the etch stop layer 500. An upper electrode 530 may be formed on the dielectric layer 520 so that the capacitor 540 including the lower electrode 510, the dielectric layer 520, and the upper electrode 530 is formed.

A third insulating interlayer 550 may be formed to cover the capacitor 540 on the substrate 100 to complete the fabrication of the semiconductor device. The third insulating interlayer 550 may include an oxide, e.g., silicon oxide.

Figure 26:
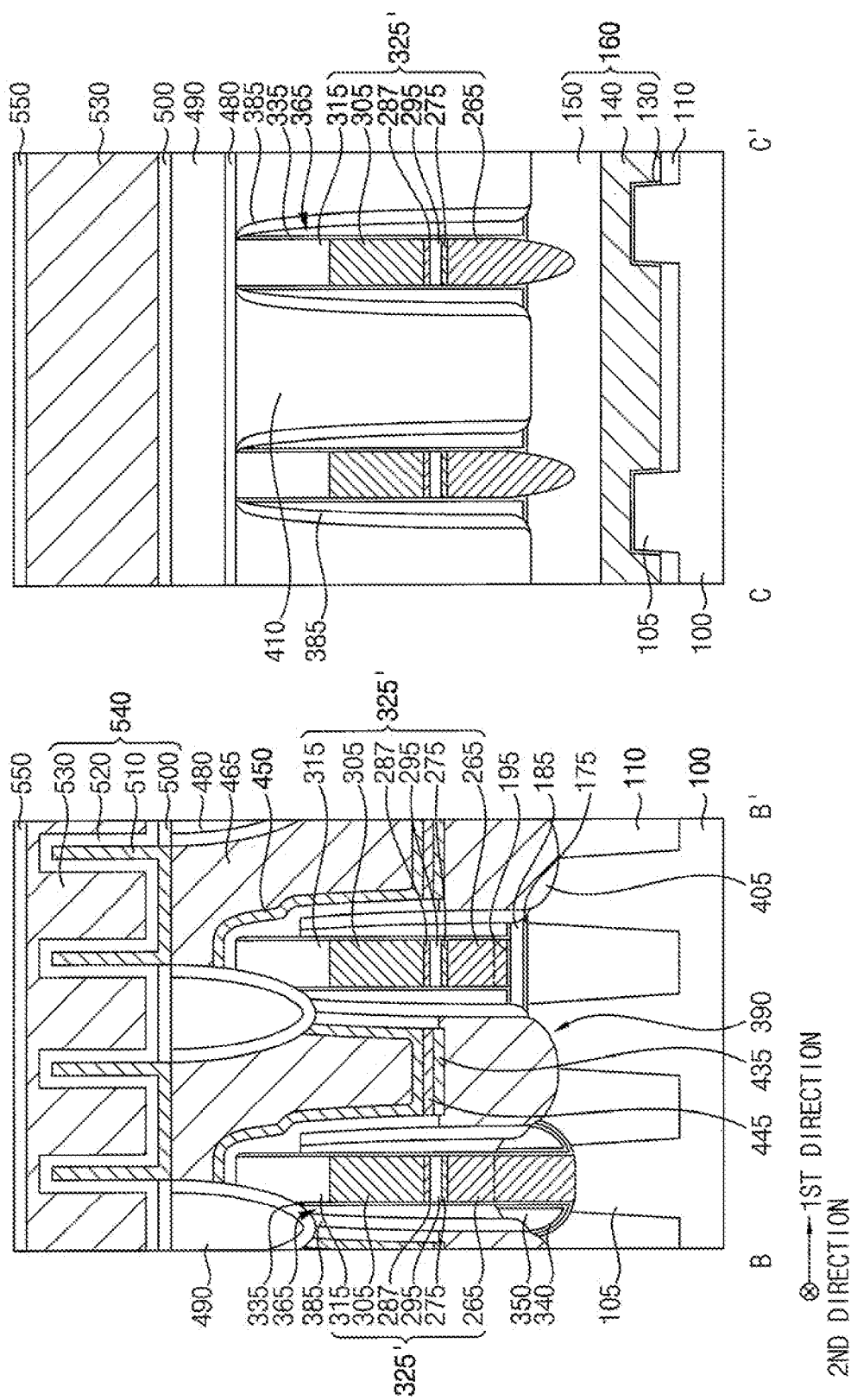
FIG. 26 is a cross-sectional view illustrating a semiconductor device in accordance with example embodiments.

FIG. 26 is a cross-sectional view illustrating a semiconductor device in accordance with example embodiments. This semiconductor device may be substantially the same as or similar to that of FIGS. 9 and 10, except for the bit line structure.

Referring to FIG. 26, a bit line structure 325' may include the conductive structure 265, the first ohmic contact pattern 275, the first diffusion barrier 295, a second oxidation prevention pattern 287, the sixth conductive pattern 305, and the first capping pattern 315 sequentially stacked.

The first ohmic contact pattern 275, the first diffusion barrier 295, and the second oxidation prevention pattern 287 may include material substantially the same as those of the ohmic contact pattern 45, the diffusion barrier 65, and the oxidation prevention pattern 57, respectively, described above in connection with FIG. 6.

Figure 27:
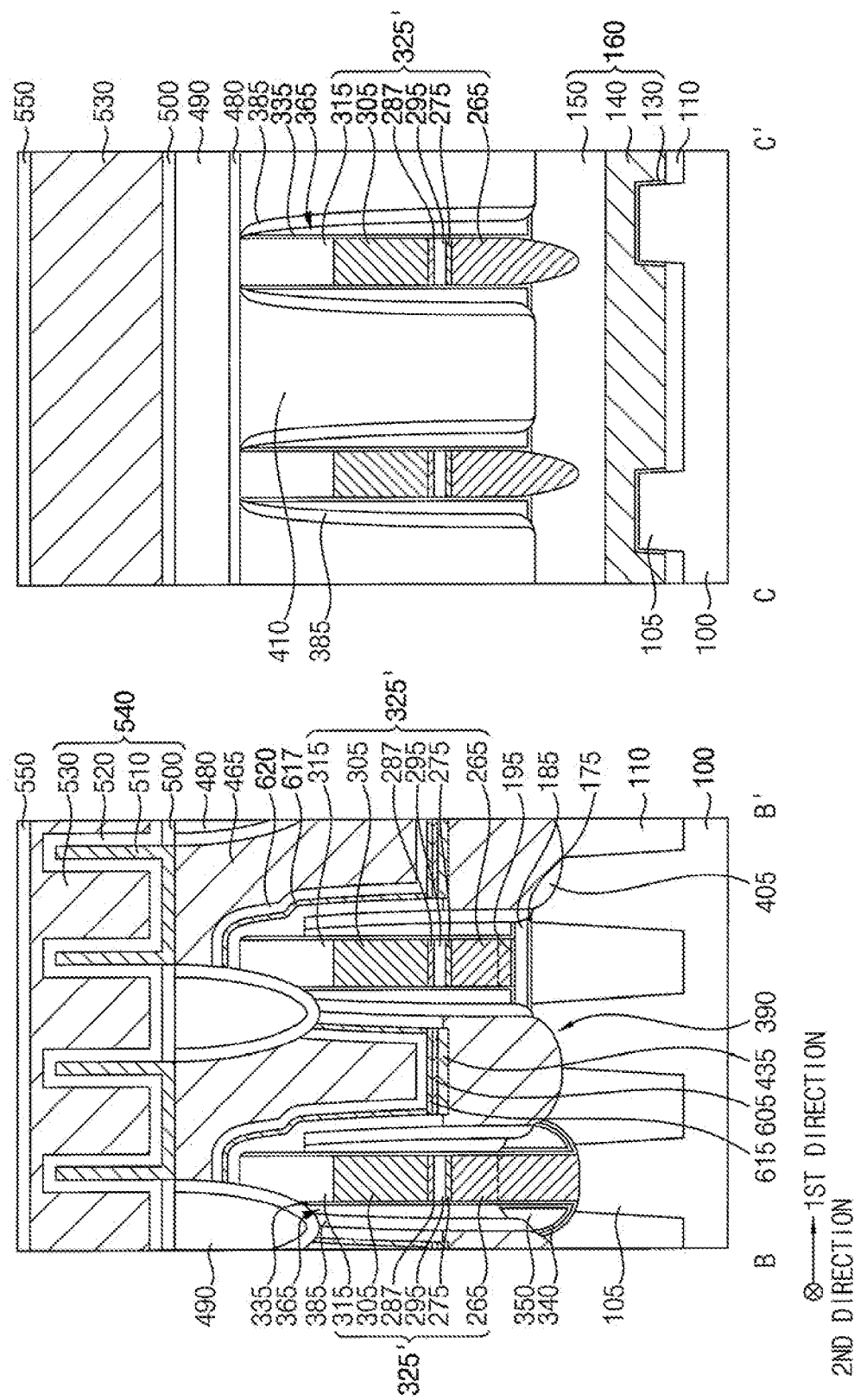
FIG. 27 is a cross-sectional view illustrating a semiconductor device in accordance with example embodiments.

FIG. 27 is a cross-sectional view illustrating a semiconductor device in accordance with example embodiments. This semiconductor device may be substantially the same as or similar to that of FIGS. 9 and 20 or FIG. 26, except for the contact plug structure.

Referring to FIG. 27, a contact plug structure may include the lower contact plug 405, the second and fourth ohmic contact patterns 435 and 605, the third oxidation prevention pattern 615, the third and fourth diffusion barrier layers 617 and 620, and the upper contact plug 465 sequentially stacked.

The fourth ohmic contact pattern 605, the third oxidation prevention pattern 615, and the fourth diffusion barrier layer 620 may include materials substantially the same as those of the ohmic contact pattern 45, the oxidation prevention pattern 55, and the diffusion barrier 65, respectively, described above in connection with FIG. 1. The third diffusion barrier layer 617 may include material substantially the same as that of the oxidation prevention pattern 57 shown in FIG. 6.

In example embodiments, the fourth ohmic contact pattern 605 may be formed on the second ohmic contact pattern 435, the third oxidation prevention pattern 615 may be formed on the fourth ohmic contact pattern 605, the third diffusion barrier layer 617 may be formed on the fourth spacer 425, and the fourth diffusion barrier layer 620 may be formed on the third oxidation prevention pattern 615 and the third diffusion barrier layer 617 to contact upper surfaces thereof. Thus, the third diffusion barrier layer 617 may contact an upper surface of each of opposite ends in the first direction of the third oxidation prevention pattern 615 and an outer sidewall of the fourth diffusion barrier layer 620.

Figure 28:
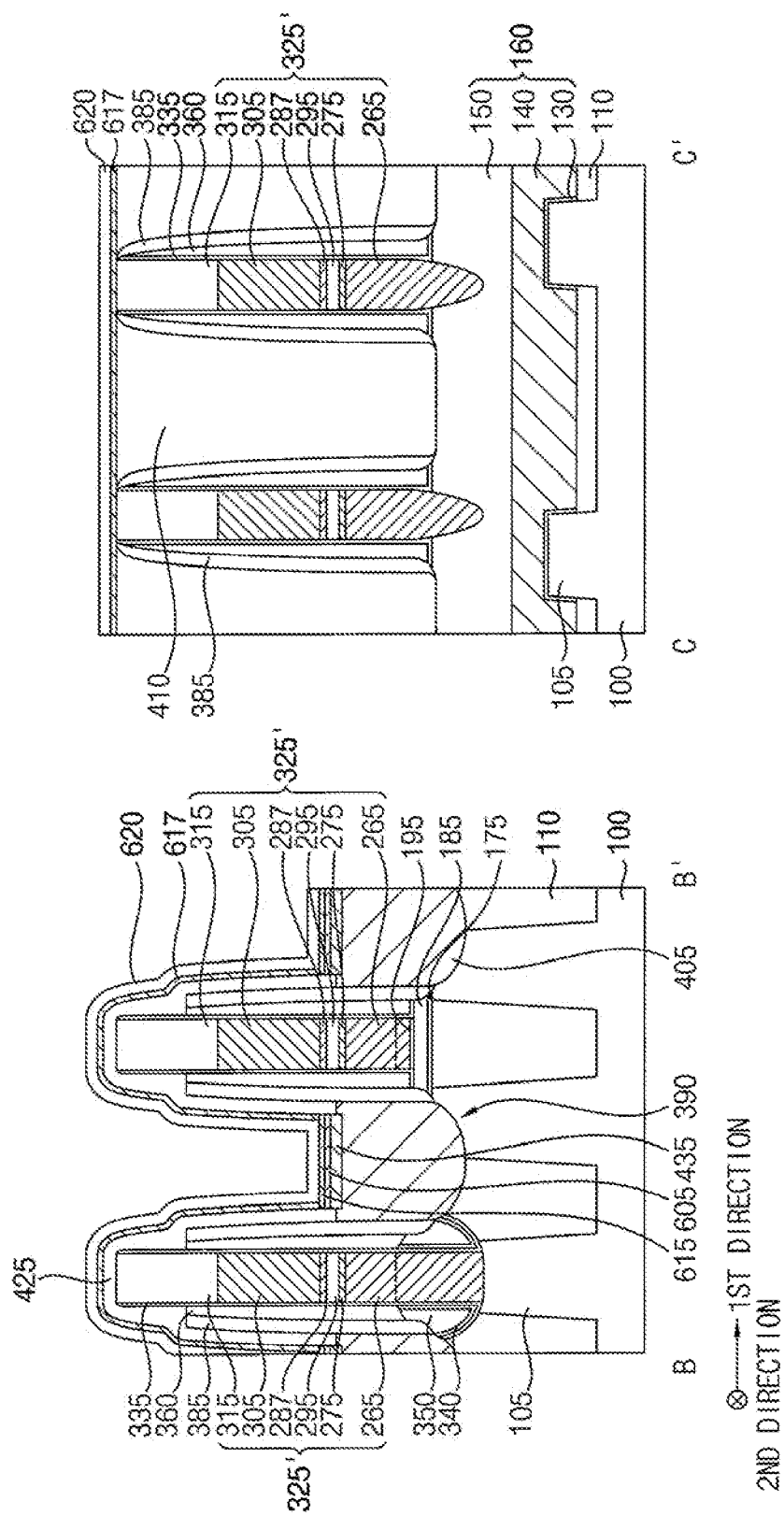
FIG. 28 is a cross-sectional view illustrating a method of manufacturing a semiconductor device in accordance with example embodiments.

FIG. 28 is a cross-sectional view illustrating a method of manufacturing a semiconductor device in accordance with example embodiments. This method may include processes substantially the same as or similar to those illustrated with reference to FIGS. 11 to 25, and FIGS. 9 and 10 or FIG. 26, and thus repeated explanations are omitted herein.

Referring to FIG. 28, processes substantially the same as or similar to those illustrated with reference to FIGS. 11 to 22 may be performed, and processes substantially the same as or similar to those illustrated with reference to FIGS. 3 to 5 may be performed.

Referring to FIG. 28, a fourth ohmic contact layer and a fourth ohmic contact pattern 605 may be formed, and then may be transformed using a nitridation treatment process into a third diffusion barrier layer 617 and a third oxidation prevention pattern 615, respectively.

For example, the fourth ohmic contact layer may be formed on the second ohmic contact pattern 435, the fourth spacer 425, and the first and second capping patterns 315 and 410. The fourth ohmic contact pattern 605 may be formed at a portion of the fourth ohmic contact layer contacting the second ohmic contact pattern 435.

In an example embodiment, the fourth ohmic contact layer may include titanium, and thus the fourth ohmic contact pattern 605 may include titanium silicide. In another implementation, the fourth ohmic contact layer may include tantalum, tungsten, etc., and thus the fourth ohmic contact pattern 605 may include tantalum silicide, tungsten silicide, etc.

The nitridation treatment process may be performed on the fourth ohmic contact layer and the fourth ohmic contact pattern 605, and thus an upper portion of the fourth ohmic contact pattern 605 may be transformed into the third oxidation prevention pattern 615, and the fourth ohmic contact layer may be transformed into the third diffusion barrier layer 617. The third oxidation prevention pattern 615 may include, e.g., tungsten silicon nitride, tantalum silicon nitride, tungsten silicon nitride, etc. The third diffusion barrier layer 617 may include, e.g., titanium nitride, tantalum nitride, tungsten nitride, etc.

A fourth diffusion barrier layer 620 may be formed on the third oxidation prevention pattern 615 and the third diffusion barrier layer 617. The fourth diffusion barrier layer 620 may include graphene.

Processes substantially the same as or similar to those illustrated with reference to FIG. 24 and FIGS. 9 and 10 may be performed to complete the fabrication of the semiconductor device.

Figure 29:
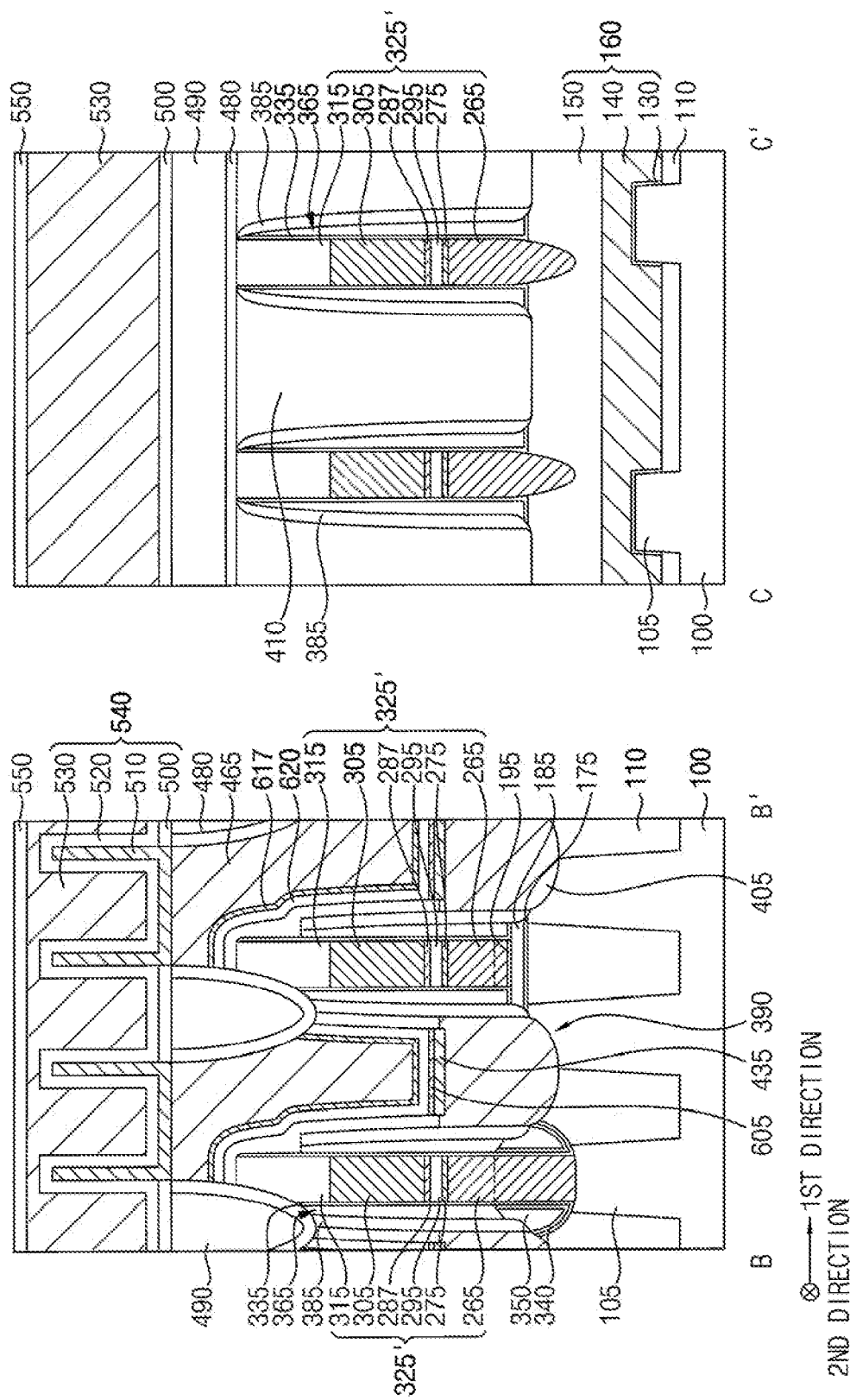
FIG. 29 is a cross-sectional view illustrating a semiconductor device in accordance with example embodiments.

FIG. 29 is a cross-sectional view illustrating a semiconductor device in accordance with example embodiments. This semiconductor device may be substantially the same as or similar to that of FIG. 27, except for the contact plug structure.

Referring to FIG. 29, the contact plug structure may include the lower contact plug 405, the second and fourth ohmic contact patterns 435 and 605, the third and fourth diffusion barrier layers 617 and 620, and the upper contact plug 465 sequentially stacked.

In example embodiments, the fourth ohmic contact pattern 605 may be formed on the second ohmic contact pattern 435. The fourth diffusion barrier layer 620 may be formed on the fourth ohmic contact pattern 605 and the fourth spacer 425. The third diffusion barrier layer 617 may be formed on the fourth diffusion barrier layer 620.

In some embodiments, the semiconductor device may include the bit line structure 325 shown in FIG. 26 and the contact plug structure shown in FIG. 27 or FIG. 29.

As described above, embodiments may provide a wiring structure having improved characteristics. Embodiments may also provide a method of forming a wiring structure having improved characteristics. Embodiments may also provide a semiconductor device having improved characteristics.

Embodiments may provide a wiring structure that has a reduced thickness and a reduced resistance. Additionally, the diffusion between patterns in the wiring structure may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A wiring structure, comprising:
a first conductive pattern on a substrate, the first conductive pattern including doped polysilicon;
an ohmic contact pattern on the first conductive pattern, the ohmic contact pattern including a metal silicide;
an oxidation prevention pattern on the ohmic contact pattern, the oxidation prevention pattern including a metal silicon nitride;
a diffusion barrier on the oxidation prevention pattern, the diffusion barrier including graphene; and
a second conductive pattern on the diffusion barrier, the second conductive pattern including a metal,
wherein the first conductive pattern, the ohmic contact pattern, the oxidation prevention pattern, the diffusion barrier, and the second conductive pattern are sequentially stacked in the stated order on the substrate.

2. The wiring structure as claimed in claim 1, wherein:
the ohmic contact pattern includes titanium silicide, and
the oxidation prevention pattern includes titanium silicon nitride.

3. The wiring structure as claimed in claim 1, wherein:
the ohmic contact pattern includes tantalum silicide or tungsten silicide, and
the oxidation prevention pattern includes tantalum silicon nitride or tungsten silicon nitride.

4. The wiring structure as claimed in claim 1, further comprising a metal oxide layer between the first conductive pattern and the oxidation prevention pattern.

5. The wiring structure as claimed in claim 4, wherein the metal oxide layer is formed only on a portion of an upper surface of the first conductive pattern.

6. The wiring structure as claimed in claim 4, wherein the metal oxide layer includes titanium oxide, tantalum oxide, or tungsten oxide.

7. The wiring structure as claimed in claim 1, wherein:
each of the ohmic contact pattern and the oxidation prevention pattern has a thickness of about 0.1 nm to about 1 nm, and
the diffusion barrier has a thickness of about 0.5 nm to about 2 nm.

8. A wiring structure, comprising:
a first conductive pattern on a substrate, the first conductive pattern including doped polysilicon;
an ohmic contact pattern on the first conductive pattern, the ohmic contact pattern including a metal silicide;
a diffusion barrier on the ohmic contact pattern, the diffusion barrier including graphene;
an oxidation prevention pattern on the diffusion barrier, the oxidation prevention pattern including a metal nitride; and
a second conductive pattern on the oxidation prevention pattern, the second conductive pattern including a metal,
wherein the first conductive pattern, the ohmic contact pattern, the diffusion barrier, the oxidation prevention pattern, and the second conductive pattern are sequentially stacked in the stated order on the substrate.

9. The wiring structure as claimed in claim 8, wherein:
the ohmic contact pattern includes tantalum silicide or tungsten silicide, and
the oxidation prevention pattern includes titanium nitride, tantalum nitride, or tungsten nitride.

10. The wiring structure as claimed in claim 8, further comprising a metal oxide layer between the first conductive pattern and the diffusion barrier.

11. The wiring structure as claimed in claim 10, wherein the metal oxide layer is formed only on a portion of an upper surface of the first conductive pattern.

12. A semiconductor device, comprising:
an active pattern on a substrate;
a gate structure buried at an upper portion of the active pattern;
a bit line structure on the active pattern;
a contact plug structure on a portion of the active pattern adjacent to the bit line structure; and
a capacitor on the contact plug structure,
wherein the bit line structure includes:

a first conductive pattern including doped polysilicon;
a first ohmic contact pattern on the first conductive pattern, the first ohmic contact pattern including a metal silicide;
a first oxidation prevention pattern on the first ohmic contact pattern, the first oxidation prevention pattern including a metal silicon nitride;
a first diffusion barrier on the first oxidation prevention pattern, the first diffusion barrier including graphene; and
a second conductive pattern on the first diffusion barrier, the second conductive pattern including a metal,
wherein the first conductive pattern, the first ohmic contact pattern, the first oxidation prevention pattern, the first diffusion barrier, and the second conductive pattern are sequentially stacked in the stated order.

13. The semiconductor device as claimed in claim 12, wherein:
the first ohmic contact pattern includes titanium silicide, tantalum silicide, or tungsten silicide, and
the first oxidation prevention pattern includes titanium silicon nitride, tantalum silicon nitride, or tungsten silicon nitride.

14. The semiconductor device as claimed in claim 12, wherein the contact plug structure includes:
a third conductive pattern including doped polysilicon;
a second ohmic contact pattern on the third conductive pattern, the second ohmic contact pattern including a metal silicide;
a third ohmic contact pattern on the second ohmic contact pattern, the third ohmic contact pattern including a metal silicide;
a second diffusion barrier on the third ohmic contact pattern, the second diffusion barrier including a metal nitride; and
a fourth conductive pattern on the second diffusion barrier, the fourth conductive pattern including a metal.

15. The semiconductor device as claimed in claim 12, wherein the contact plug structure includes:
a third conductive pattern including doped polysilicon;
a second ohmic contact pattern on the third conductive pattern, the second ohmic contact pattern including a metal silicide;
a third ohmic contact pattern on the second ohmic contact pattern, the third ohmic contact pattern including a metal silicide;
a second oxidation prevention pattern on the third ohmic contact pattern, the second oxidation prevention pattern including a metal silicon nitride;
a second diffusion barrier on the second oxidation prevention pattern, the second diffusion barrier including graphene; and
a fourth conductive pattern on the second diffusion barrier, the fourth conductive pattern including a metal.

16. The semiconductor device as claimed in claim 12, wherein the contact plug structure includes:
a third conductive pattern including doped polysilicon;
a second ohmic contact pattern on the third conductive pattern, the second ohmic contact pattern including a metal silicide;
a third ohmic contact pattern on the second ohmic contact pattern, the third ohmic contact pattern including a metal silicide;
a second diffusion barrier on the third ohmic contact pattern, the second diffusion barrier including graphene;
a third diffusion barrier on the second diffusion barrier, the second diffusion barrier including a metal nitride; and
a fourth conductive pattern on the third diffusion barrier, the fourth conductive pattern including a metal.

17. A semiconductor device, comprising:
an active pattern on a substrate;
a gate structure buried at an upper portion of the active pattern;
a bit line structure on the active pattern;
a contact plug structure on a portion of the active pattern adjacent to the bit line structure; and
a capacitor on the contact plug structure,
wherein the bit line structure includes:
a first conductive pattern including doped polysilicon;
a first ohmic contact pattern on the first conductive pattern, the first ohmic contact pattern including a metal silicide;
a first diffusion barrier on the first ohmic contact pattern, the first diffusion barrier including graphene;
an oxidation prevention pattern on the first diffusion barrier, the oxidation prevention pattern including a metal nitride; and
a second conductive pattern on the oxidation prevention pattern, the second conductive pattern including a metal,
wherein the first conductive pattern, the first ohmic contact pattern, the first diffusion barrier, the oxidation prevention pattern, and the second conductive pattern are sequentially stacked in the stated order.

18. The semiconductor device as claimed in claim 17, wherein:
the first ohmic contact pattern includes titanium silicide, tantalum silicide, or tungsten silicide, and
the oxidation prevention pattern includes titanium nitride, tantalum nitride, or tungsten nitride.

19. The semiconductor device as claimed in claim 17, wherein the contact plug structure includes:
a third conductive pattern including doped polysilicon;
a second ohmic contact pattern on the third conductive pattern, the second ohmic contact pattern including a metal silicide;
a third ohmic contact pattern on the second ohmic contact pattern, the third ohmic contact pattern including a metal silicide;
a second diffusion barrier on the third ohmic contact pattern, the second diffusion barrier including a metal nitride; and
a fourth conductive pattern on the second diffusion barrier, the fourth conductive pattern including a metal.

20. The semiconductor device as claimed in claim 19, wherein:
the second ohmic contact pattern includes cobalt silicide or nickel silicide,
the third ohmic contact pattern includes titanium silicide, and
the second diffusion barrier includes titanium nitride.

* * * * *